(12) United States Patent
Yamazaki

(10) Patent No.: US 7,405,665 B2
(45) Date of Patent: Jul. 29, 2008

(54) SEMICONDUCTOR DEVICE, RFID TAG AND LABEL-LIKE OBJECT

(75) Inventor: Shunpei Yamazaki, Setagaya (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 202 days.

(21) Appl. No.: 11/013,370

(22) Filed: Dec. 17, 2004

(65) Prior Publication Data

US 2005/0134463 A1 Jun. 23, 2005

(30) Foreign Application Priority Data

Dec. 19, 2003 (JP) ............................. 2003-423872

(51) Int. Cl.
*G08B 13/14* (2006.01)

(52) U.S. Cl. ................. 340/572.8; 340/572.1; 235/492; 257/679

(58) Field of Classification Search ............... 340/572.8, 340/572.1, 572.5, 572.7, 571, 568.1; 235/492, 235/383, 385; 29/825, 843, 845; 257/679, 257/678, 666, 773, 674
See application file for complete search history.

(56) References Cited

U.S. PATENT DOCUMENTS

| 5,198,831 | A | 3/1993 | Burrell et al. |
| 5,403,700 | A | 4/1995 | Heller et al. |
| 5,643,826 | A | 7/1997 | Ohtani et al. |
| 5,703,755 | A | 12/1997 | Flesher et al. |
| 5,821,138 | A | 10/1998 | Yamazaki et al. |
| 6,100,804 | A * | 8/2000 | Brady et al. ............. 340/572.7 |

(Continued)

FOREIGN PATENT DOCUMENTS

| JP | 2000-299440 | 10/2000 |
| WO | WO-1999/030432 | 6/1999 |

OTHER PUBLICATIONS

"*Sense of Crisis*" *is a Trigger: Ignited Evolution of a Sesame-Grain Sized Chip*, Nikkei Electronics, Nov. 18, 2002, pp. 67-76.

(Continued)

*Primary Examiner*—Anh V La
(74) *Attorney, Agent, or Firm*—Eric J. Robinson; Robinson Intellectual Property Law Office, P.C.

(57) ABSTRACT

An object of the present invention is to supply a semiconductor device capable of communicating data through radio communication, such as an RFID tag or a label-like object, with high productivity at low cost. In the invention, a memory portion, a signal control circuit portion and a communication circuit portion are formed with the use of a TFT formed over an insulating substrate, and the insulating substrate is fixed opposite to a support provided with an antenna so that the antenna is connected to a terminal portion connected to a communication circuit. The invention is an RFID tag and a label-like object including an ID chip whose memory portion, signal control portion and communication circuit portion are formed with the use of TFTs formed over an insulating substrate and an antenna formed to connect to a terminal portion of the ID chip, in which data stored in a memory portion or data to be stored in a memory portion can be communicated through a communication circuit by radio communication.

16 Claims, 19 Drawing Sheets

U.S. PATENT DOCUMENTS

| | | | |
|---|---|---|---|
| 6,164,551 A * | 12/2000 | Altwasser | 235/492 |
| 6,239,703 B1 * | 5/2001 | Friedman et al. | 340/572.7 |
| 6,372,608 B1 | 4/2002 | Shimoda et al. | |
| 6,478,229 B1 | 11/2002 | Epstein | |
| 6,509,217 B1 | 1/2003 | Reddy | |
| 6,521,489 B2 | 2/2003 | Duthaler et al. | |
| 6,774,470 B2 | 8/2004 | Yagi et al. | |
| 6,870,461 B2 * | 3/2005 | Fischer et al. | 340/10.1 |
| 6,994,414 B2 | 2/2006 | Hashimoto et al. | |
| 7,036,741 B2 | 5/2006 | Usami et al. | |
| 7,037,752 B2 | 5/2006 | Kuwabara et al. | |
| 7,130,234 B2 | 10/2006 | Shionoiri et al. | |
| 7,180,093 B2 | 2/2007 | Takayama et al. | |
| 2003/0024635 A1 | 2/2003 | Utsunomiya | |
| 2003/0032210 A1 | 2/2003 | Takayama et al. | |
| 2003/0083203 A1 | 5/2003 | Hashimoto et al. | |
| 2003/0134488 A1 | 7/2003 | Yamazaki et al. | |
| 2004/0128246 A1 | 7/2004 | Takayama et al. | |
| 2004/0129450 A1 | 7/2004 | Yamazaki et al. | |
| 2004/0164302 A1 | 8/2004 | Arai et al. | |
| 2004/0245519 A1 | 12/2004 | Van De Walle et al. | |
| 2004/0245525 A1 | 12/2004 | Yamazaki et al. | |
| 2005/0045729 A1 | 3/2005 | Yamazaki | |
| 2005/0051870 A1 | 3/2005 | Yamazaki et al. | |
| 2005/0130389 A1 | 6/2005 | Yamazaki et al. | |
| 2005/0133790 A1 | 6/2005 | Kato | |
| 2005/0134463 A1 | 6/2005 | Yamazaki | |
| 2005/0135181 A1 | 6/2005 | Shionoiri et al. | |
| 2005/0148121 A1 | 7/2005 | Yamazaki et al. | |
| 2006/0163710 A1 | 7/2006 | Kuwabara et al. | |
| 2007/0159335 A1 | 7/2007 | Arai et al. | |

OTHER PUBLICATIONS

Nikkei Electronics, *Sesame-Grain Sized Chip as Source*, Feb. 25, 2002, pp. 109-137.

B. Lee et al., "A CPU on a Glass Substrate Using CG-Silicon TFTs," ISSCC Digest of Technical Papers, pp. 164-165, 2003.

T. Ikeda et al., "Full-Functional System Liquid Crystal Display Using CG-Silicon Technology," SID Digest of Technical Papers, pp. 860-863, 2004.

T. Takayama et al., "A CPU on a plastic film substrate," VLSI Technology Digest of Technical Papers, pp. 230-231, 2004.

M. Usami, A. Sato, K. Sameshima, K. Watanabe, H. Yoshigi, R. Imura, "22.7 Powder LSI: An Ultra Small RF Identification Chip for Individual Recognition Applications," ISSCC Digest of Technical Papers, 2003, 3 pages.

* cited by examiner

SEMICONDUCTOR DEVICE, RFID TAG AND LABEL-LIKE OBJECT

BACKGROUND OF THE INVENTION

1. Field of the Invention

The present invention relates to a semiconductor device which transmits and receives data through radio communication. Specifically, the invention relates to a semiconductor device in which an integrated circuit is formed with a thin film over an insulating substrate containing glass or the like and to an ID tag and a label-like object using the semiconductor device.

2. Description of the Related Art

A technology referred to as radio frequency identification (also referred to as RFID) has been attracting attention in place of a code referred to as a barcode used for identifying products and the like. RFID is an automatic identification technique utilizing radio communication, and its system is built with a reader/writer device, an IC chip for storing data, and the like. Specifically, the one used for identifying articles is referred to as an RFID tag or the like. The RFID tag is formed by a combination of an antenna and an IC chip provided with a memory and a communication circuit. The size of the IC chip is 2 mm or less on a side (for example, Reference 1: Takahashi et al., "Source is a sesame-sized chip", Nikkei Electronics, Nikkei Business Publications, Inc., Feb. 25, 2002 issue, No. 816, pp. 109–137).

The IC chip included in the RFID tag is manufactured by employing a manufacturing technique of a semiconductor integrated circuit with the use of a silicon wafer in the same manner as a memory, a microprocessor, or the like.

They say that it is difficult to expand the use of the RFID technology unless the RFID tag drops in price to 10 yen or less.

However, a large amount of facility investment is required to build a new production line of IC chips adopting a manufacturing technique of a semiconductor integrated circuit. Accordingly, it becomes difficult to manufacture IC chips at low cost. For example, facility investment of approximately 150 billion yen is required to build a production line adopting a 12-inch wafer. When running cost is added, it becomes very difficult to make a unit price of the IC chip 100 yen or less.

The 12-inch wafer has an area of approximately 73,000 mm². Without taking it into account that a processing margin of about 100 μm is required in separating the wafer with a dicing apparatus having a blade of from 20 μm to 50 μm in width, only 73000 chips can be obtained in the case of cutting out 1 mm square chips. Even when 0.4 mm square chips are cut out of the 12-inch wafer, only 182500 chips can be obtained. Therefore, it is very difficult to secure sufficient supply. Thus, production of an RFID tag based on a manufacturing technique of a semiconductor integrated circuit has a problem with cost and stable supply in terms of quantity.

In addition, an IC chip manufactured by using a single crystal silicon substrate has a cleavage plane and has an essential problem that it is sensitive to impact and bending stress. Therefore, the IC chip used for an RFID tag is reduced in size, and treatment of specially scraping the substrate is performed to flake the IC chip. Since scraping an ultra-pure single crystal silicon substrate wastes resources and generates industrial waste, a problem is left also in terms of an environmental issue.

SUMMARY OF THE INVENTION

It is an object of the present invention to supply a semiconductor device capable of transmitting and receiving data through radio communication, such as an RFID tag or a label-like object, with high productivity at low cost. Here, the label-like object means a label or a packaging. The label-like object may be referred to as either one which includes an ID chip and an antenna, or one which does not include an ID chip and an antenna. The product name, raw materials, place of the product and the like may be shown on the surface of the label-like object.

The invention provides a semiconductor device, an RFID tag and a label which transmit and receive data through radio communication with the use of thin film transistors (hereinafter also referred to as "TFTs") in which channel forming regions are formed by using semiconductor layers which are separately formed over an insulating substrate.

One of the embodiments of the invention a semiconductor device in which a memory portion, a signal control circuit portion and a communication circuit portion are formed with the use of TFTs whose channel forming regions are formed by using crystalline semiconductor films which are separately formed over an insulating substrate, and a terminal portion connected to the communication circuit portion is connected with an antenna.

One of the embodiments of the invention is a semiconductor device in which a memory portion, a signal control circuit portion and a communication circuit portion are formed with the use of TFTs whose channel forming regions are formed by using crystalline semiconductor films which are separately formed over an insulating substrate, and the insulating substrate and a support provided with an antenna are fixed with facing to each other so that the antenna is connected to a terminal portion connected to a communication circuit.

One of the embodiments of the invention is an ID chip in which a memory portion, a signal control portion and a communication circuit portion are formed with the use of TFTs having channel forming regions formed by using crystalline semiconductor layers which are separately formed over an insulating substrate, and an RFID tag and a label-like object including an antenna formed so as to connect to a terminal portion of the ID chip, in which data stored in the memory portion or data to be stored in the memory portion can be communicated through the communication circuit by radio communication.

One of the embodiments of the invention is an RFID tag and a label-like object in which an ID chip whose memory portion, signal control portion and communication circuit portion are formed with the use of TFTs having channel forming regions formed by using crystalline semiconductor films which is are separately formed over an insulating substrate and a support provided with an antenna so as to connect to a terminal portion of the ID chip are fixed with facing to each other and attached to a packaging or one side of a label.

One of the invention is an RFID tag and a label-like object in which an ID chip whose memory portion, signal control circuit portion and communication circuit portion are formed with the use of TFTs having channel forming regions formed by using crystalline semiconductor films which are separately formed over an insulating substrate, a terminal portion of the ID chip and an antenna provided for a packaging or one side of a label are fixed with facing and connected to each other.

Of course, structures of the ID chip, the RFID tag and the label-like object are variable. Modifications such as providing an additional circuit necessary for radio frequency identification or another functional circuit in addition to the memory portion, the signal control circuit portion and the communication circuit portion can be made without departing from the scope of the invention.

According to the invention, a semiconductor device capable of communicating data stored in a memory or data to be stored in a memory through a communication circuit by radio communication can be provided with high productivity at low cost by manufacturing the semiconductor device with TFTs formed over an insulating substrate. In addition, it is possible to improve impact resistance and to prevent deterioration in crystal characteristics due to distortion of a crystal structure.

BRIEF DESCRIPTION OF DRAWINGS

FIG. 10 is a longitudinal sectional view showing one mode of an ID chip provided with TFTs capable of forming a memory portion, a signal control circuit portion, a communication circuit portion, and the like.

FIG. 13 is a longitudinal sectional view showing one mode of an ID chip provided with TFTs capable of forming a memory portion, a signal control circuit portion, a communication circuit portion, and the like.

DETAILED DESCRIPTION OF THE INVENTION

Figure 1:
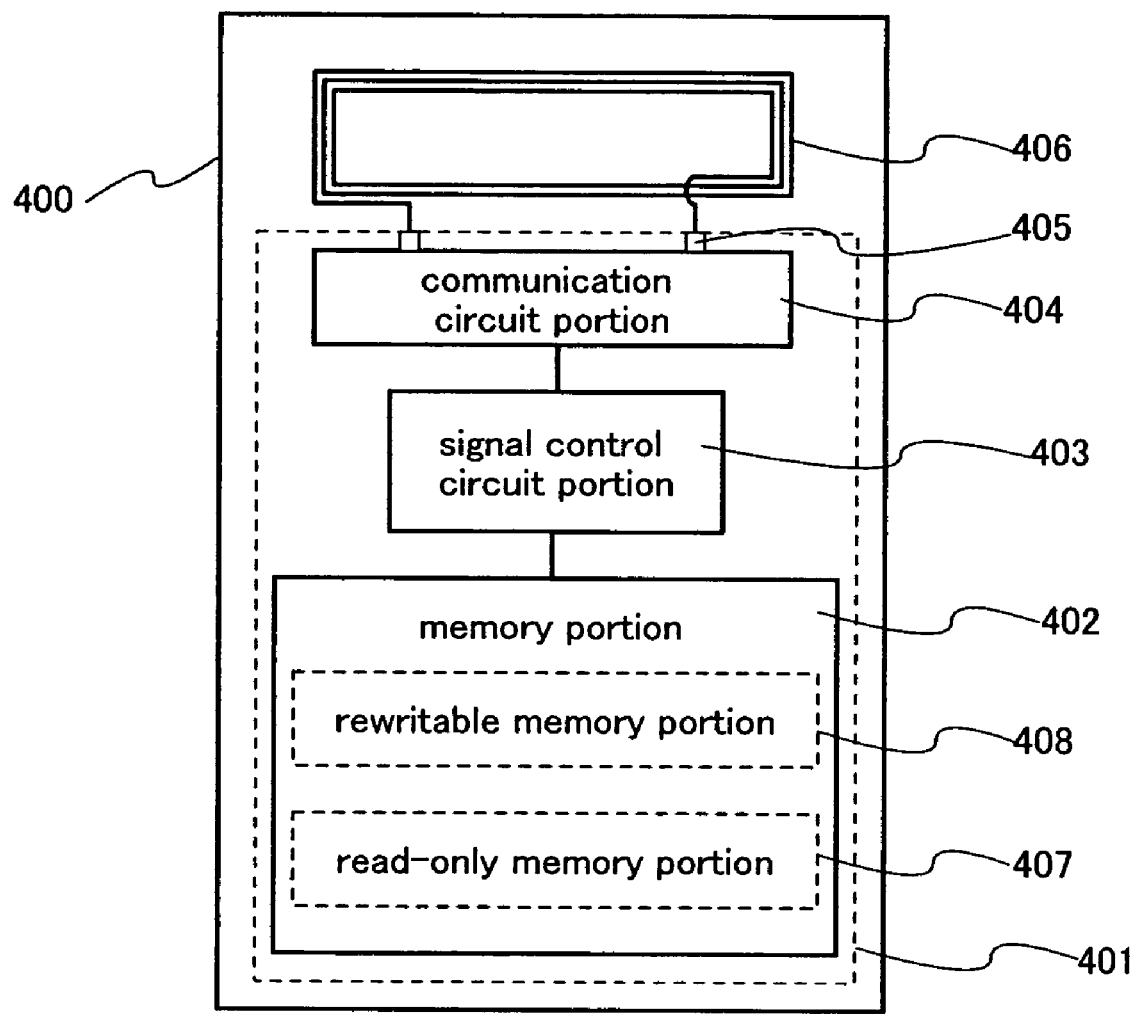
FIG. 1 is a block diagram showing a main structure of an RFID semiconductor device of the present invention.

An embodiment mode of the present invention is hereinafter described with reference to the attached drawings. Note that the present invention is not limited to the following description. As is easily known to a person skilled in the art, the mode and the detail of the invention can be variously changed without departing from the purpose and the scope of the present invention. Therefore, the present invention is not interpreted limiting to the following description of the embodiment mode. Note that the same reference numeral is given to the same portion or a portion having a similar function among different diagrams to be described hereinafter, and repetitive description is omitted.

FIG. 1 is a block diagram showing a main structure of an RFID semiconductor device 400 of the present invention. In an ID chip 401, a memory portion 402, a signal control circuit portion 403 and a communication circuit portion 404 are formed with the use of a TFT formed over an insulating substrate. The communication circuit portion 404 is connected to an antenna portion 406 with a connection terminal portion 405. The antenna portion 406 may be integrally formed over the insulating substrate provided with the TFT. Alternatively, the antenna portion 406 may be formed over another support and may be connected with the ID chip 401 through the connection terminal portion 405.

The memory portion 402 may have a structure including either or both a read-only memory portion 407 and a rewritable memory portion 408. Only the read-only memory portion 407 is required when the memory is used only to read out data stored in the memory for individual identification. The rewritable memory portion 408 may be added in the case where data needs to be rewritten on an as-needed basis to store a record of a product.

The read-only memory portion 407 may be made to store data at the production stage like a mask ROM or may include a programmable ROM whose data can be rewritten by a user. An electrically erasable programmable ROM (an EEPROM or a flash memory) or the like is applicable to the programmable ROM. A static RAM, an EEPROM, a flash memory, or the like is applicable to the rewritable memory portion 408.

Electric power required to operate the memory portion 402, the signal control circuit portion 403 and the like is obtained by receiving electromagnetic waves supplied from a device referred to as a reader/writer by the antenna portion 406. A frequency band of the electromagnetic waves may be a long wave band of up to 135 kHz, a short wave band of from 6 MHz to 60 MHz, typically, 13.56 MHz, an ultrashort wave band of from 400 MHz to 950 MHz, a microwave band of from 2 GHz to 25 GHz, or the like. A long wave band or short wave band antenna utilizes electromagnetic induction of a loop antenna. Alternatively, it may utilize mutual induction (electromagnetic coupling) or electrostatic induction (electrostatic coupling). The antenna can be formed over an insulating substrate or a support by a printing method or an etching method.

A glass substrate of aluminosilicate glass, barium borosilicate glass or the like, also referred to as non-alkaline glass, a molten or synthetic quartz substrate, a ceramic glass substrate or the like can be used as the insulating substrate used for the ID chip 401 shown in FIG. 1. Alternatively, an industrial plastic substrate of polyethylene naphthalate, polyether sulfone or the like can be used.

In the TFT, a channel forming region is preferably formed with a crystalline semiconductor layer which is formed by crystallizing an amorphous semiconductor layer formed by a vapor phase growth method, with the use of light energy or thermal energy. It is preferable to use a crystalline semiconductor layer in which high field effect mobility is obtained, in the case of forming a communication circuit utilizing a high frequency band like 13.56 MHz or 915 MHz or a microwave band like 2.45 GHz. An example of the crystalline semiconductor layer is a crystalline silicon film having field effect mobility of from 50 $cm^2$/Vsec to 250 $cm^2$/Vsec, formed by pulsed laser annealing or a crystalline silicon film having field effect mobility of from 300 $cm^2$/Vsec to 600 $cm^2$/Vsec, formed by continuous wave or radio-frequency pulsed laser annealing. The TFT preferably has a channel length of approximately from 0.5 µm to 8 µm in response to high speed operation. The TFT structure is not particularly limited to a top gate type, a bottom gate type or the like. Alternatively, a crystalline semiconductor layer may be directly formed by a vapor phase growth method.

Figure 2A:
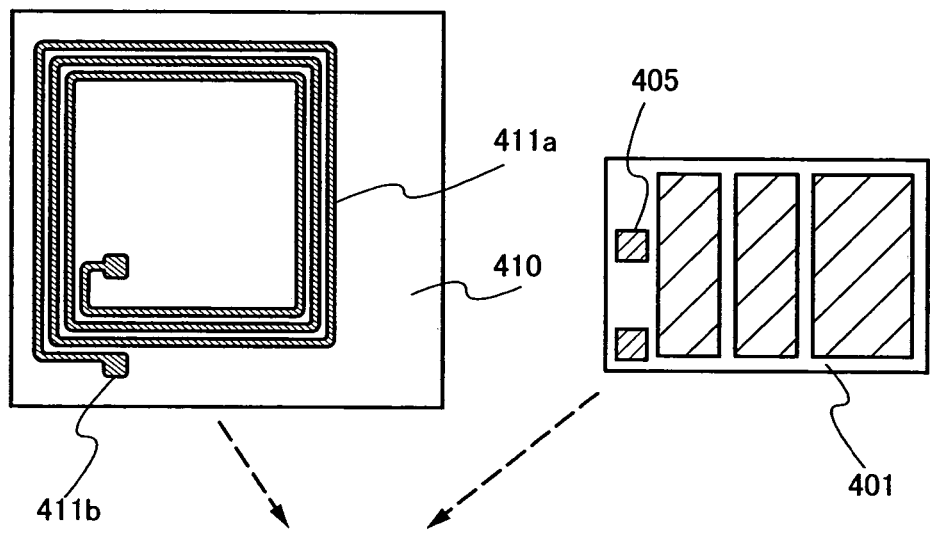
FIGS. 2A to 2C are top views showing one mode of a combination of an ID chip and an antenna.
Figure 2B:
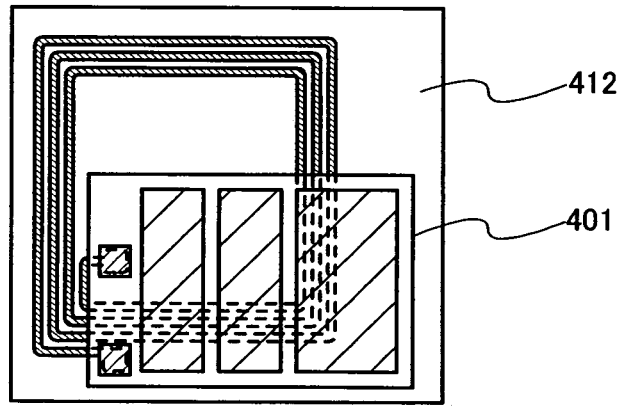
Figure 2C:
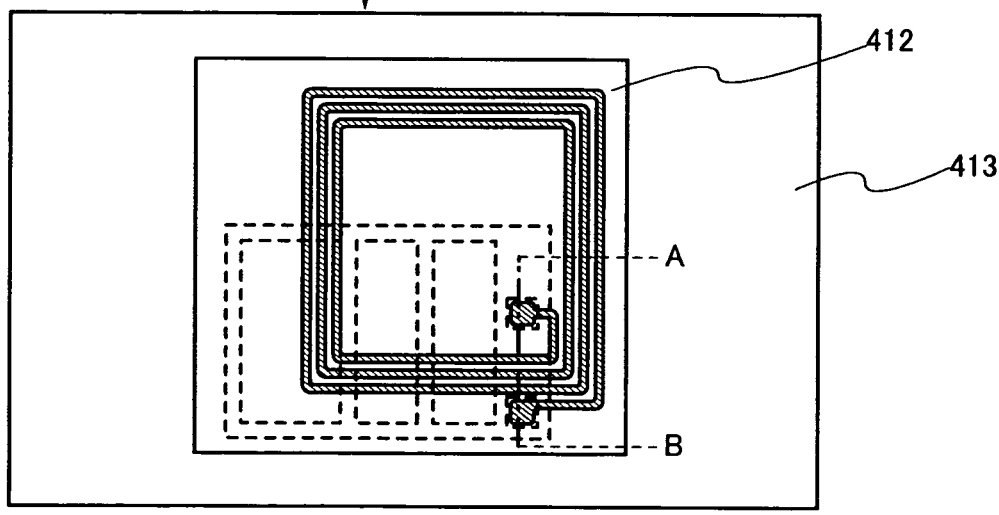

One mode of a combination of an ID chip and an antenna is described with reference to FIGS. 2A to 2C. FIGS. 2A to 2C show a structure in which a support 410 provided with an antenna 411a is fixed opposite to an ID chip 401 including a memory, a signal control circuit portion, a communication circuit portion, and the like which are formed with the use of an integrated circuit.

As shown in FIG. 2A, the ID chip 401 is provided with connection terminal portions 405. End portions of the antenna 411a formed over the support 410 are provided with terminal portions 411b. The antenna 411a can be formed by a printing method using copper or silver paste. In addition, the antenna may be formed by a photolithography technique using a metal film of gold, copper, silver, aluminum or the like formed by sputtering or a vacuum vapor deposition method. Alternatively, the antenna may be formed by etching a plated thin metal plate of copper or silver. Paper, nonwoven fabric, plastic, ceramic or the like can be employed as the support 416.

Figure 3:
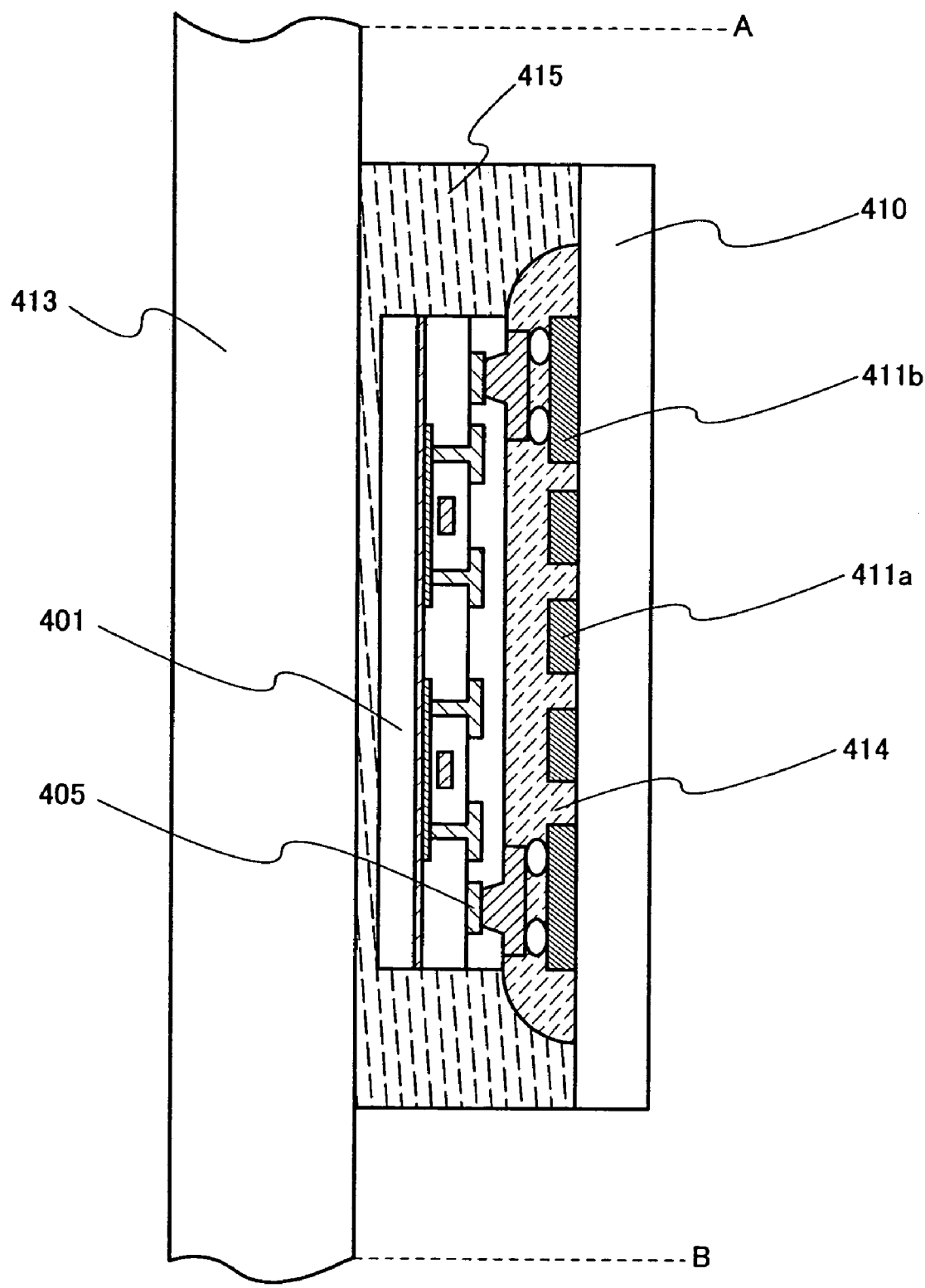
FIG. 3 is a cross-sectional view showing one mode of a combination of an ID chip and an antenna (a longitudinal sectional view taken along a section line A–B in FIG. 2C).

Subsequently, the terminal portion 411b of the antenna 411a and the connection terminal portion 405 of the ID chip 401 are fixed to electrically connect to each other as shown in FIG. 2B. As shown in FIG. 3, both terminals may be electrically connected to each other with an anisotropic conductive adhesive 414. Thus, a semiconductor device 412 in which the antenna 411a and the ID chip 401 are integrated can be obtained.

Thereafter, the semiconductor device 412 is attached to a backside (opposite side to a print side) of a label-like object 413 in which a print side is formed on one side, as shown in FIG. 2C. Note that a longitudinal sectional view taken along a section line A–B shown in FIG. 2C is shown in FIG. 3. As shown in FIG. 3, the support 410 is attached to the label-like object 413 with an adhesive 415. The label-like object 413 includes the ID chip 401, which makes it possible to control information on an article to which the label-like object is attached in place of a conventional barcode.

Another mode of a combination of an ID chip and an antenna is described with reference to FIGS. 4A to 4C. Note that a longitudinal sectional view taken along a section line A–B shown in FIG. 4C is shown in FIG. 5, so it may be referred to as well.

Figure 4A:
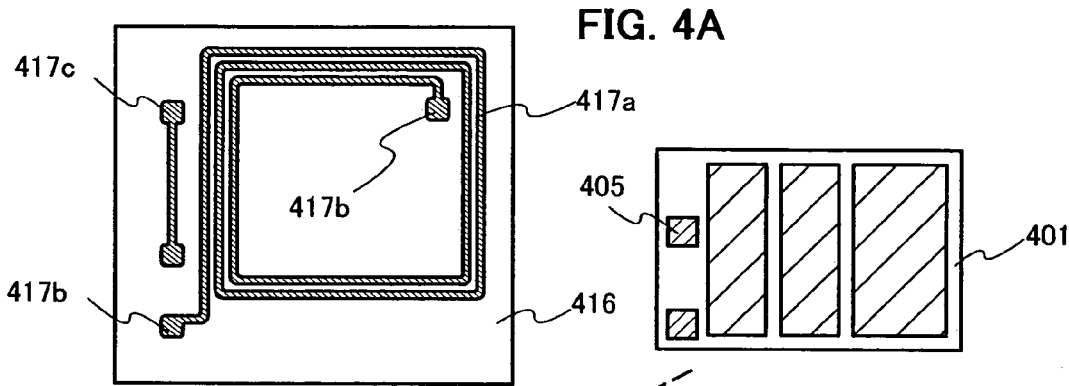
FIGS. 4A to 4C are top views showing one mode of a combination of an ID chip and an antenna.
Figure 5:
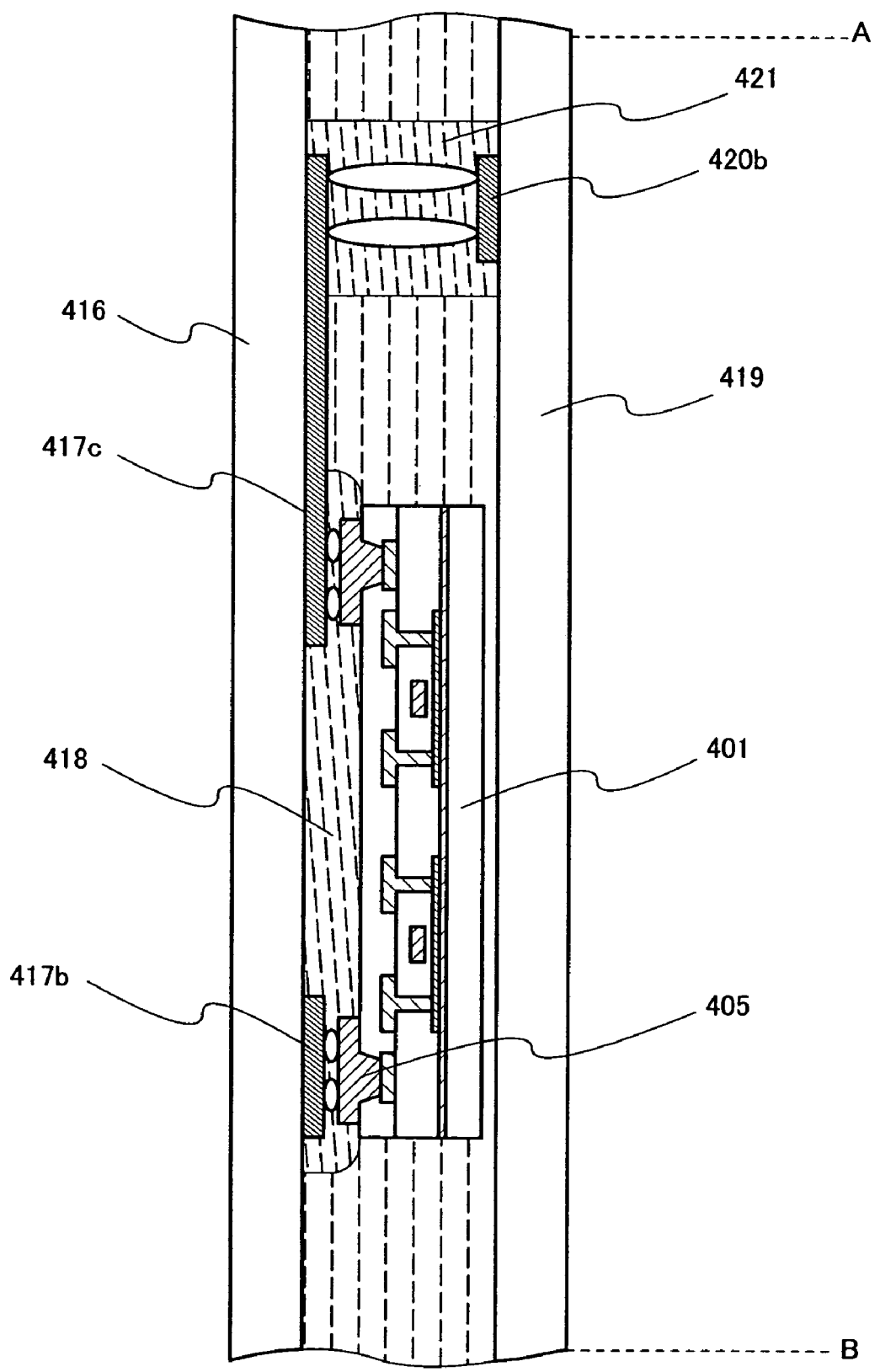
FIG. 5 is a cross-sectional view showing one mode of a combination of an ID chip and an antenna (a longitudinal sectional view taken along a section line A–B in FIG. 4C).

In FIG. 4A, an antenna 417a is formed over a support 416. The antenna 417a can be formed by a printing method using copper or silver paste. Alternatively, the antenna may be formed by a photolithography technique using a metal film of gold, copper, silver, aluminum or the like formed by sputtering or a vacuum vapor deposition method. Alternatively, the antenna may be formed by etching a plated thin metal plate of copper or silver. Paper, nonwoven fabric, plastic, ceramic or the like can be employed as the support 416.

A coupling line 417c of the antenna is used for connection of antenna 417a and an antenna formed over an opposing support. One end and the other end of the antenna 417a and the coupling line 417c are provided with terminal portions 417b. The connection terminal portions 405 are fixed to the terminal portions 417b of the antenna and the coupling line 417c so as to be electrically connected and opposed to each other, as shown in FIG. 4B. An anisotropic conductive adhesive 418 may be used as shown in FIG. 5 to establish the electrical connection.

Figure 4B:
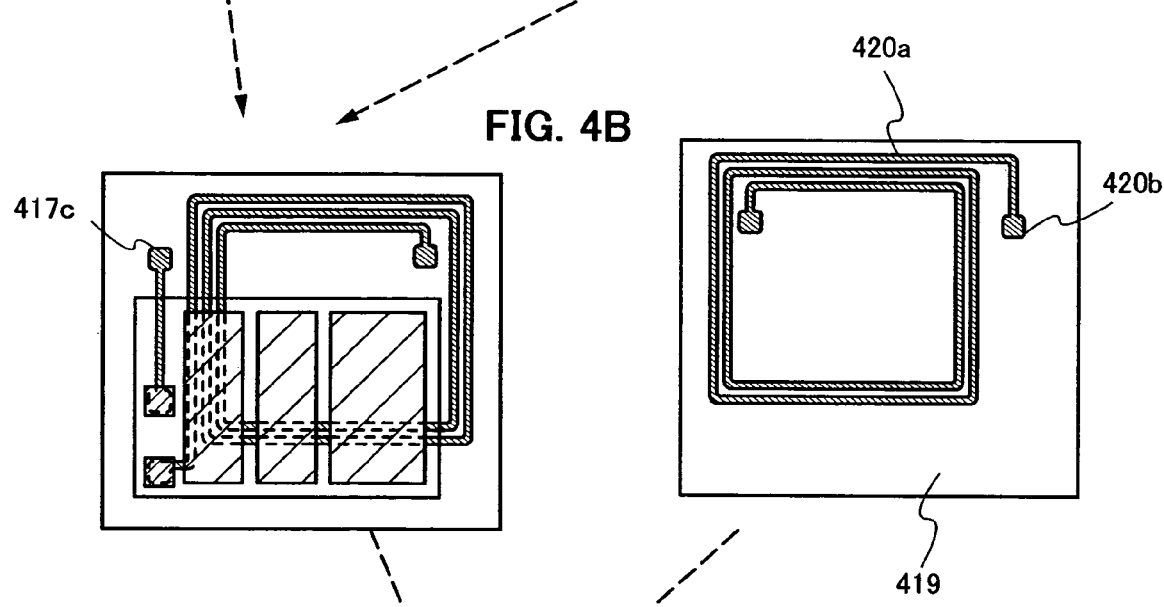
Figure 4C:
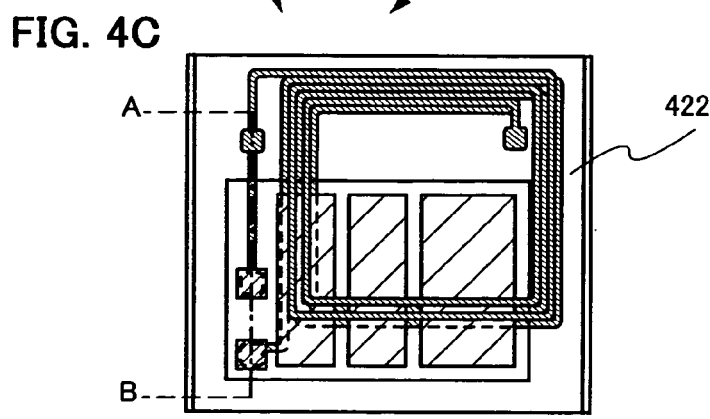

As shown in FIG. 4B, another support 419 is provided with an antenna 420a in order to increase the number of windings of the antenna. Then, a terminal portion 420b thereof is attached to connect to the coupling line 417c. In order to establish electrical connection, the terminal portion 420b and the coupling line 417c are attached to be opposed to each other using an anisotropic conductive adhesive 421 as shown in FIG. 5. A semiconductor device 422 in which the antennas 417a and 420a and the ID chip 401 are integrated can be obtained by sealing in the ID chip between the supports as shown in FIG. 4C. Providing both of the supports with antennas makes it possible to communicate by radio communication with similar sensitivity from both sides. In addition, an insulating substrate of glass, quartz or the like does not lead to malfunction of a TFT by absorbing electromagnetic waves; thus, a highly reliable semiconductor device can be obtained. In addition, the semiconductor device can be utilized as an electronic tag by attaching it to an article or the like using an opposite side to an antenna formation face of either or both the supports as a print side.

Figure 6:
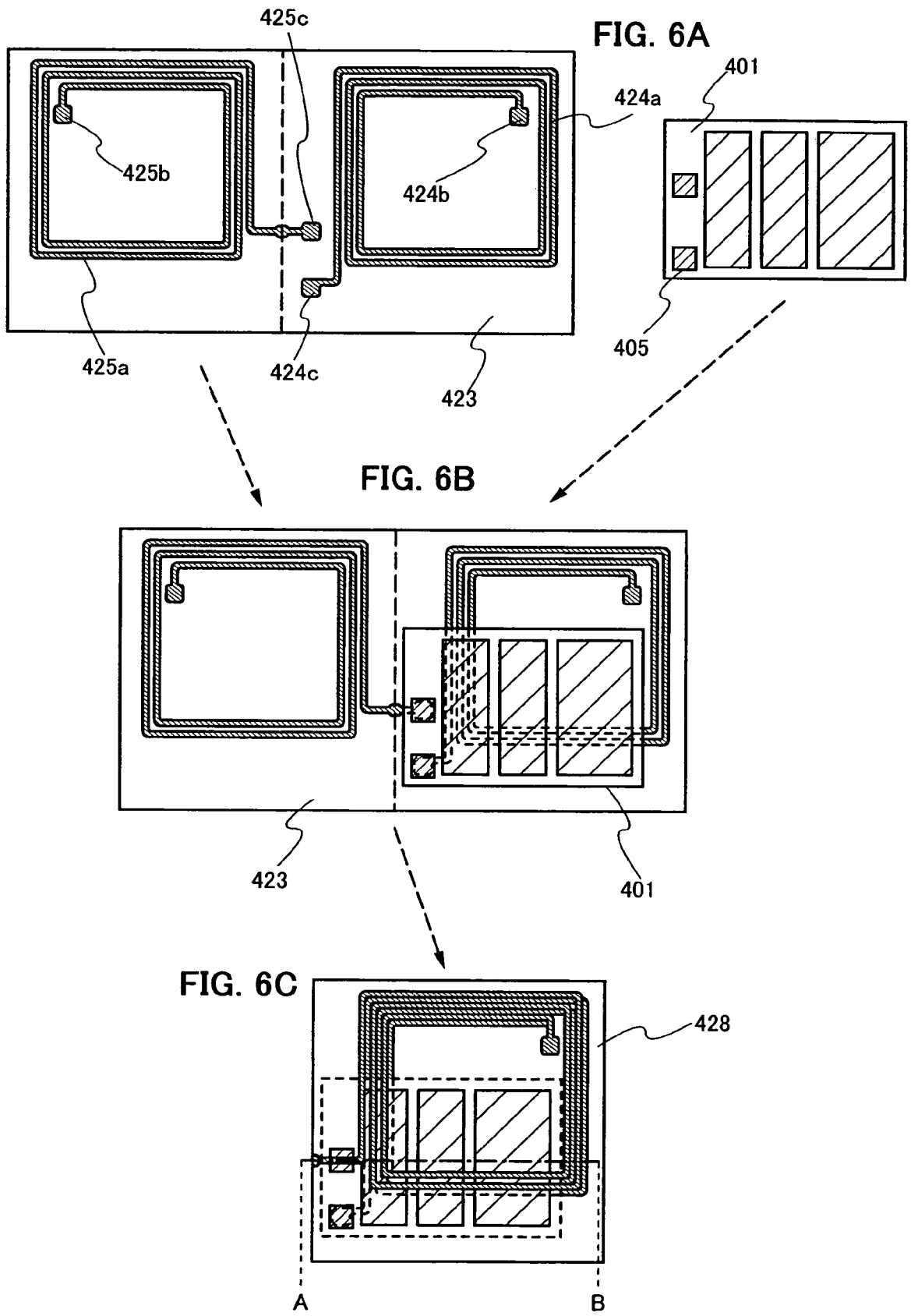
FIGS. 6A to 6C are top views showing one mode of a combination of an ID chip and an antenna.
Figure 7:
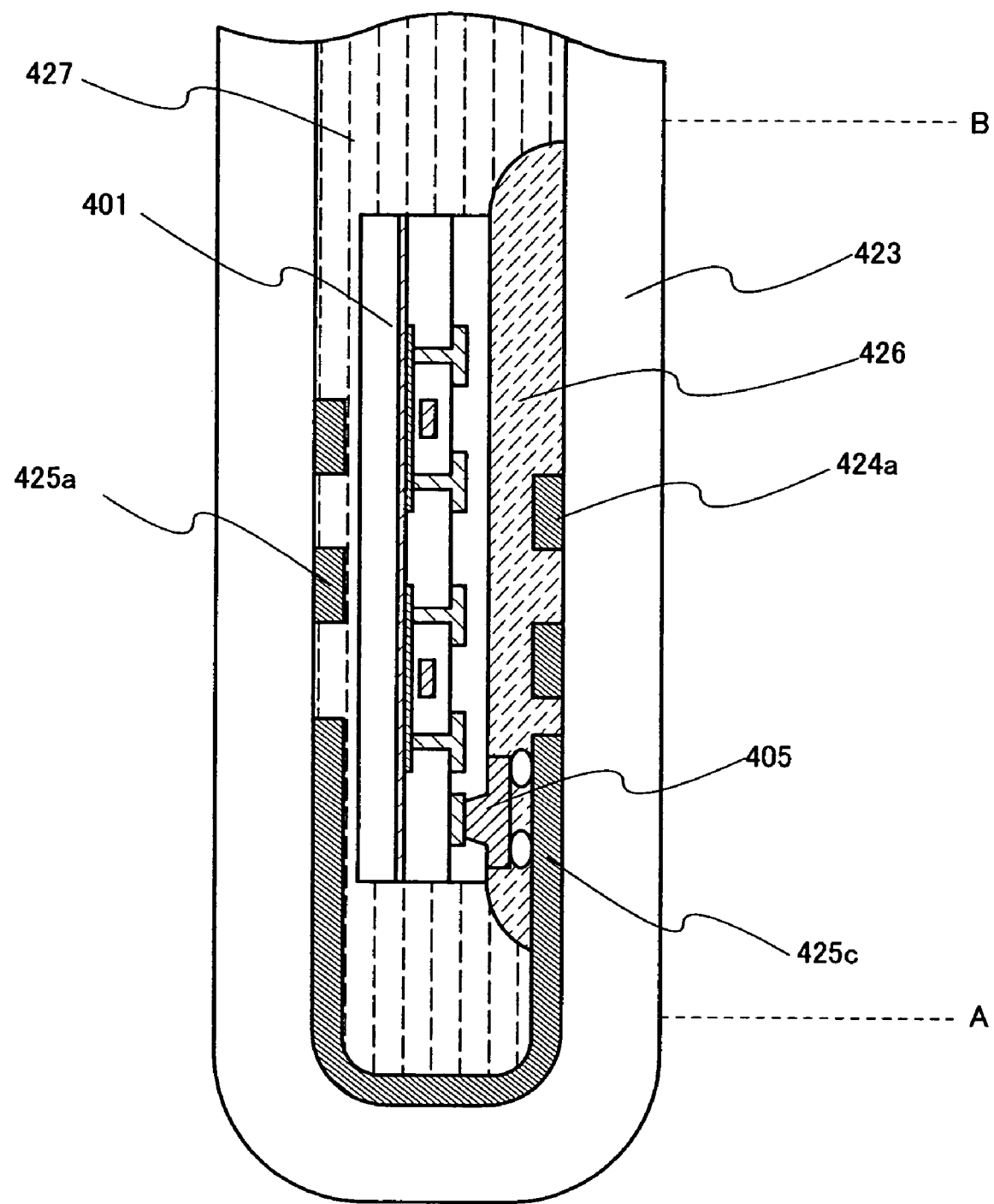
FIG. 7 is a cross-sectional view showing one mode of a combination of an ID chip and an antenna (a longitudinal sectional view taken along a section line A–B in FIG. 6C).

Another mode of a combination of an ID chip and an antenna is described with reference to FIGS. 6A to 6C. Note that a longitudinal sectional view taken along a section line A–B shown in FIG. 6C is shown in FIG. 7, so it may be referred to as well.

A support 423 shown in FIG. 6A is a folding type. When the support 423 is folded into two, an antenna 424a and an antenna 425a are connected at respective terminal portions 425b and 424b. As shown in FIG. 6B, connection terminal portions 405 of an ID chip 401 are fixed to electrically connect to a terminal portion 424c and a terminal portion 425c of the antennas. As shown in FIG. 7, the connection terminal portion 405 is connected to the terminal portion 425c of the antennas to be opposed to each other with an anisotropic conductive adhesive 426.

Subsequently, FIG. 6C shows a mode of folding the support 423 and sealing the ID chip 401 inside of the support 423. The ID chip 401 can be fixed by filling the inside of the folded support 423 with an organic resin 427 of silicone, epoxy, acrylic or the like. According to this, impact resistance is improved, thereby preventing the ID chip 401 from being damaged. Thus, a semiconductor device 428 in which the antennas and the ID chip are integrated can be obtained. In addition, an RFID tag and a label-like object can be obtained by attaching the semiconductor device to an article or the like using either or both sides opposite to an antenna formation face of the support as a print side.

Another mode of a combination of an ID chip and an antenna is described with reference to FIGS. 8A to 8C. Note that a longitudinal sectional view taken along a section line A–B shown in FIG. 8C is shown in FIG. 9, so it may be referred to as well.

Figure 8A:
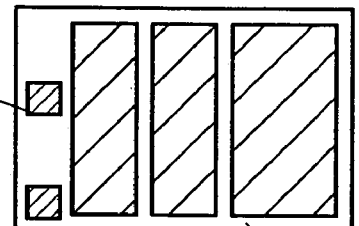
FIGS. 8A to 8C are top views showing one mode of a combination of an ID chip and an antenna.
Figure 8B:
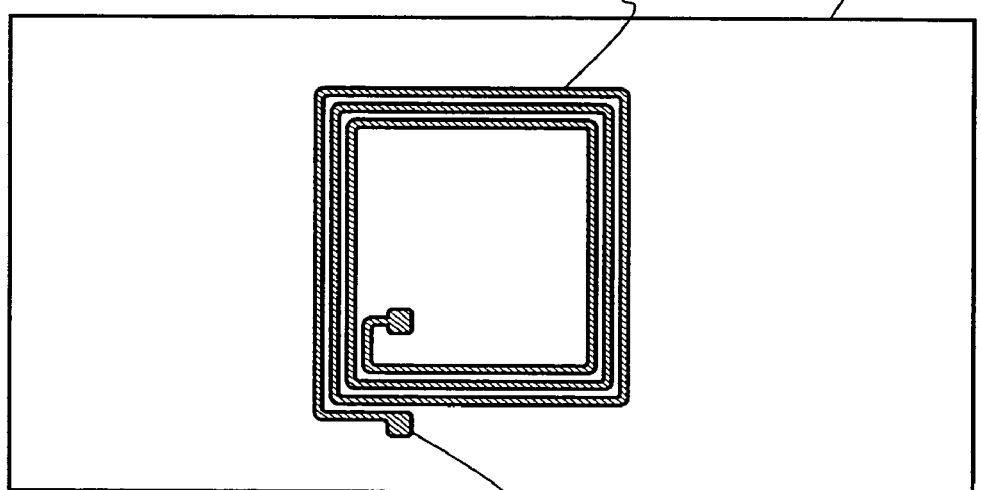
Figure 8C:
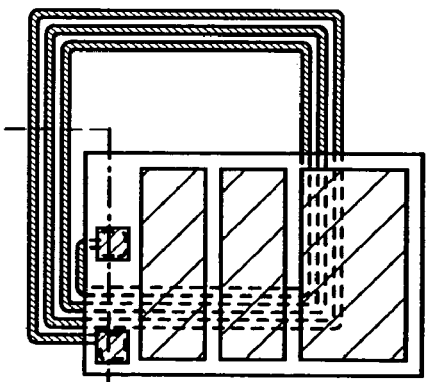
Figure 9:
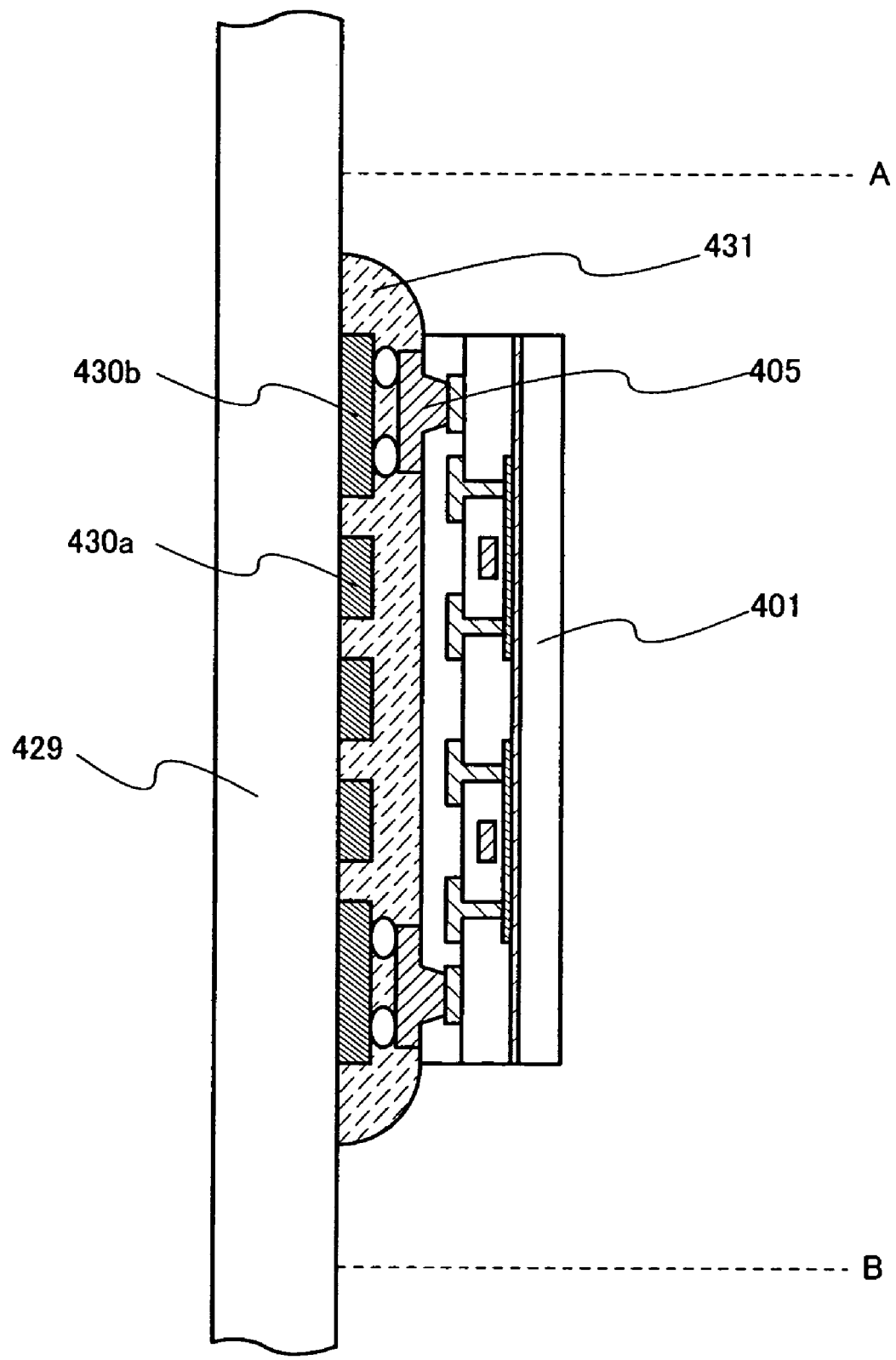
FIG. 9 is a cross-sectional view showing one mode of a combination of an ID chip and an antenna (a longitudinal sectional view taken along a section line A–B in FIG. 8C).

FIGS. 8A to 8C show a mode of attaching an ID chip 401 directly to a label-like object 429 provided with an antenna 430a. The antenna 430a is preferably formed on an opposite side to a print side of the label-like object 429 and can be formed by a printing method using copper or silver paste. In addition, the antenna may be formed by a photolithography technique using a metal film of gold, copper, silver, aluminum or the like formed by sputtering or a vacuum vapor deposition method. Alternatively, the antenna may be formed by etching a plated thin metal plate of copper or silver. Paper, nonwoven fabric, plastic, ceramic, or the like can be employed as the label-like object 429.

Flexibility of the label can be retained by forming the antenna 430a to have a thickness of 20 µm or less by a printing method or an etching method as described above. FIG. 8C shows a mode of attaching connection terminal portions 405 of the ID chip 401 to terminal portions 430b of the antenna 430a to electrically connect to each other. FIG. 9 shows a structure of a cross section taken along to a line A–B in FIG. 8C. FIG. 9 shows a mode of connecting the connection terminal portions 405 of the ID chip to the terminal portions 430b of the antenna with anisotropic conductive adhesives 431. A label-like object 432 includes the antenna 430a and the ID chip 401, which makes it possible to control information on an article to which the label-like object is attached in place of a conventional barcode.

Figure 10:
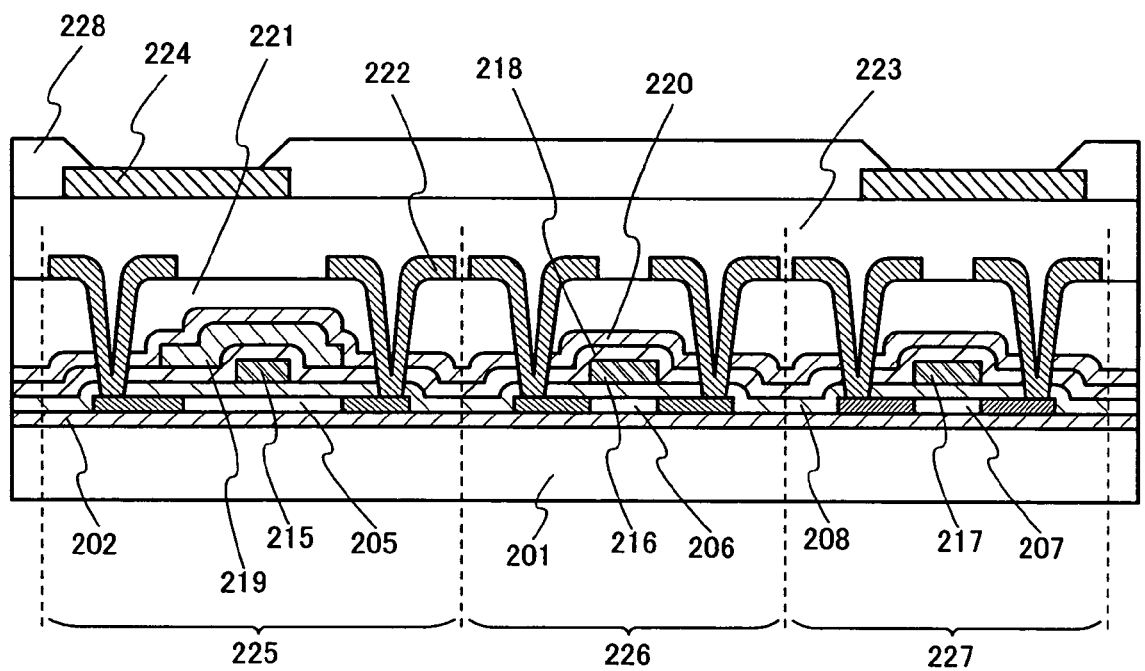

FIG. 10 is a longitudinal sectional view showing a mode of an ID chip provided with a TFT which forms a memory portion, a signal control circuit portion, a communication circuit portion, and the like. A TFT 225 provided with a floating gate 215 and a control gate 219, an n-channel TFT 226 and a p-channel TFT 227 are formed over an insulating substrate 201.

A crystalline semiconductor layer is preferably used for semiconductor layers 205, 206 and 207 for forming channel forming region regions of the TFTs. The crystalline semiconductor layer can be formed by crystallizing an amorphous semiconductor layer with the use of light energy or thermal energy.

A semi-amorphous (also referred to as microcrystal) semiconductor (hereinafter, also referred to as a "SAS") manufactured by a vapor phase growth method or a sputtering method using a semiconductor material gas typified by silane or germane, or the like can also be used. The SAS means a semiconductor having an intermediate structure between an amorphous structure and a crystalline structure (including single crystal and polycrystal) and having a third state which is stable in terms of free energy, and includes a crystalline region having short-range order and lattice distortion. A crystalline region of from 0.5 nm to 20 nm can be observed in at least a part of a region in the film. When silicon is contained as the main component, a Raman spectrum is shifted to a lower frequency side than 520 cm$^{-1}$. A diffraction peak of (111) or (220) to be caused by a crystal lattice of silicon is observed in X-ray diffraction. Hydrogen or halogen of at least 1 atomic % or more is contained as a neutralizer of a dangling bond. The SAS is formed by performing glow discharge decomposition (plasma CVD) on a silicide gas. $SiH_4$ can be used as a silicide gas. In addition, $Si_2H_6$, $SiH_2Cl_2$, $SiHCl_3$, $SiCl_4$, $SiF_4$, or the like can also be used. Further, $GeF_4$ may be mixed. The silicide gas may be diluted with $H_2$, or $H_2$ and one or more rare gas elements of He, Ar, Kr and Ne. It is desirable that an atmospheric constituent impurity such as oxygen, nitrogen or carbon is $1\times10^{20}$ cm$^{-1}$ or less as an impurity element in the film; specifically, an oxygen concentration is $5\times10^{19}$/cm$^3$ or less, preferably $1\times10^{19}$/cm$^3$ or less. Field effect mobility of the n-channel TFT of from 5 cm$^2$/Vsec to 50 cm$^2$/Vsec can be accomplished by using the SAS.

A first insulating layer 202 serves as a base barrier layer, and it may be omitted in the case of using quartz for the insulating substrate. A second insulating layer 208 is formed over the semiconductor layers 205, 206 and 207 to function as a gate insulating film. A third insulating layer 218 is formed over the gate electrode (floating gate) 215 and is used as a gate insulating film for the control gate 219. A fourth insulating layer 220 is a protective layer and may be provided if necessary.

A fifth insulating layer 221 may be formed to have an even surface, and a wiring 222 is formed thereover. The wiring 222 is connected to a source/drain region or the gate electrode of the TFT by utilizing a contact hole formed in each insulating layer therebelow, and the wiring is used in forming a desired circuit. The wiring may have a multilayer structure with an insulating layer therebetween, and FIG. 10 shows a state in which a connection terminal portion 224 is formed with a conductive layer over a sixth insulating layer 223. A seventh insulating layer 228 is a protective layer which exposes a surface of the connection terminal portion 224 and covers the rest and may be provided appropriately.

The TFT 225 is used to form a rewritable memory portion; in some cases, it becomes unnecessary depending on a memory portion structure. The TFT 226 and the TFT 227 can form various signal control circuits, communication circuits and memory circuits such as an SRAM. The TFTs 226 and 227 shown in FIG. 10 have a single gate structure, but this embodiment mode is not limited thereto. The TFTs may have an LDD structure or a multigate structure if necessary. They may have a dual gate structure in the case of forming gate electrodes 216 and 217 with polysilicon.

An antenna is preferably formed using a low resistant material and is formed using a metal material having low resistivity such as gold, silver or copper. Specifically, a thin line (in the shape of a wire) of gold, silver, copper or the like may be formed to be embedded in a support, or the antenna may be formed using conductive paste by ink-jet or a screen printing method. Alternatively, the antenna may be formed by etching a thin metal plate attached onto the support or by plating. The antenna may be formed by a photolithography method using a metal film formed by sputtering to promote the miniaturization thereof.

One mode of a manufacturing step of the ID chip shown in FIG. 10 is described with reference to FIGS. 11A to 11E.

Figure 11A:
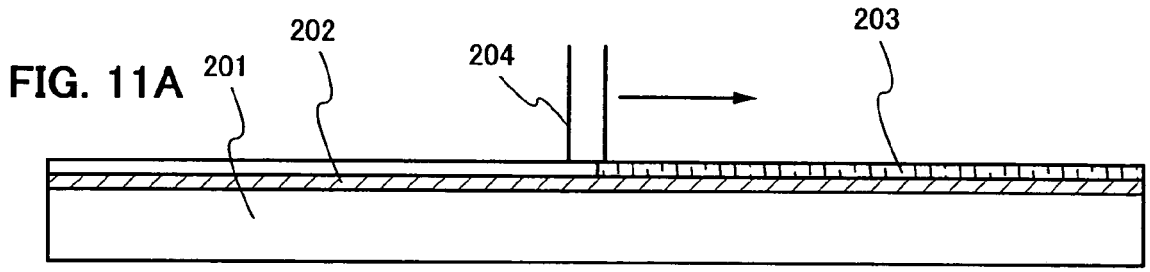
FIGS. 11A to 11E are a longitudinal sectional view showing an example of a manufacturing step of an ID chip.

In FIG. 11A, a first insulating layer 202 is formed over an insulating substrate 201. The first insulating layer 202 is provided to prevent an impurity from dispersing from the insulating substrate 201, which may be omitted in the case of using quartz. A semiconductor layer 203 is formed by a chemical film formation method or a physical film formation method. For example, a vapor phase growth method (CVD method) using a silane or disilane gas is given as the chemical film formation method, which includes a low pressure (thermal) CVD method, a plasma CVD method and the like. As for the physical film formation method, a sputtering method is known as a typical example thereof.

A crystalline semiconductor layer may be directly formed as the semiconductor layer 203 over the insulating substrate 201. However, it is preferable to use an amorphous semiconductor layer which is formed over the insulating substrate 201 and is crystallized by irradiation with an energy beam such as laser light or by heat treatment. Typically, a semiconductor layer having an amorphous structure is formed by decomposing silane or disilane by thermal or electromagnetic energy and depositing it. A so-called laser annealing technique by which a laser beam that is pulsed light or continuous light is radiated is employed to crystallize the semiconductor layer. A laser is a gas laser typified by an excimer laser or a solid state laser typified by YAG and YVO$_4$. Light having a wavelength of an ultraviolet light band or a visible light band is converged by an optical system to perform crystallization.

In laser annealing, a crystal having a large grain size can be obtained when crystallization is performed by radiating a continuous wave or high repetition (a repetition frequency thereof is 10 MHz or more) pulsed laser beam. Laser annealing is a technique for crystallization by continuously moving a region in the semiconductor layer melted by irradiating the semiconductor layer with a laser beam (hereinafter referred to as a "molten zone") along with laser beam scanning. According to laser annealing, a crystalline semiconductor layer in which a crystal grain is elongated in a scanning direction of the laser beam can be formed. When a circuit is arranged so that a channel forming region of the TFT is formed in the crystal grain, it is possible to substantially obtain equivalent performance to a MOS transistor formed with a single crystal semiconductor.

Figure 12:
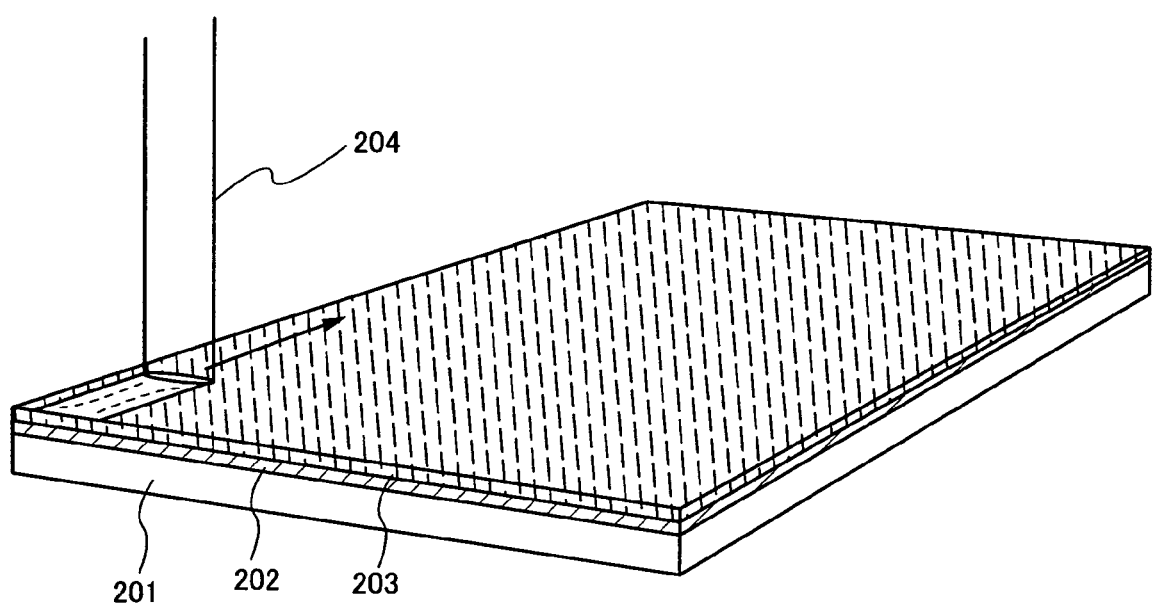
FIG. 12 shows one mode of crystallizing a semiconductor layer formed over an insulating substrate by laser annealing.

In the case of performing crystallization by radiating a continuous wave or high repetition (a repetition frequency thereof is 10 MHz or more) pulsed laser beam, a solid state laser (typified by a YAG laser, a $YVO_4$ laser or the like) oscillator can be used as a laser oscillator. A laser beam of approximately from 0.4 mm to 1 mm in a longitudinal direction can be obtained on an irradiation surface by converging a laser beam to be linear or elliptical so that crystallization can be performed. A crystallized region can be formed in the semiconductor layer 203 over the insulating substrate 201 when the converged laser beam scans in a direction along a shorter side of the laser beam as shown in FIG. 12. The ID chip is manufactured to have a size of 1 mm or less; therefore, a crystallized region of approximately 1 mm is sufficient.

When quartz is used for the insulating substrate, it can withstand heat treatment at a temperature of 900° C. or more. Therefore, crystallization of the semiconductor layer can be performed at 600° C. or more. For example, crystallization of amorphous silicon can be performed at 600° C., and a gate insulating film of a silicon oxide film can be formed by thermal CVD at 800° C. or more. In addition, heat treatment can be performed at 900° C. or more, and a gate insulating film can be formed by thermal oxidation.

On the other hand, in the case of using a glass substrate having a distortion temperature of 700° C. or less, a semiconductor layer can be formed with a silicon film crystallized by laser annealing. In addition, a semiconductor layer formed by adding an amorphous silicon film with an element such as nickel which promotes crystallization, crystallizing by heat treatment, and further laser annealing, preferably in which a concentration of a catalytic element is decreased by gettering treatment thereafter may be used.

Figure 11B:
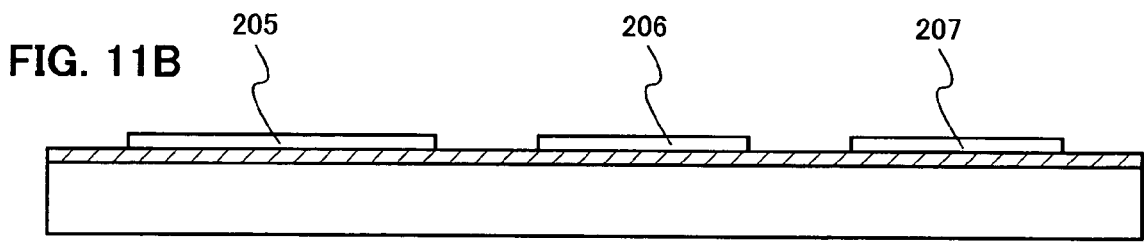

As shown in FIG. 11B, the crystallized semiconductor layer 203 is divided into a desired shape by etching. The semiconductor layers 205, 206 and 207 for forming channel forming regions or source/drain regions of the TFTs are formed depending on circuit arrangement.

In this embodiment mode, a mode of forming a TFT forming a nonvolatile memory having a floating gate and n-channel and p-channel TFTs included in a signal control circuit or a communication circuit is described in the following description with reference to FIGS. 11C to 11E. The TFT having a floating gate for forming a nonvolatile memory is formed with the use of the semiconductor layer 205. The n-channel TFT is formed with the use of the semiconductor layer 206. The p-channel TFT is formed with the use of the semiconductor layer 207.

Figure 11C:
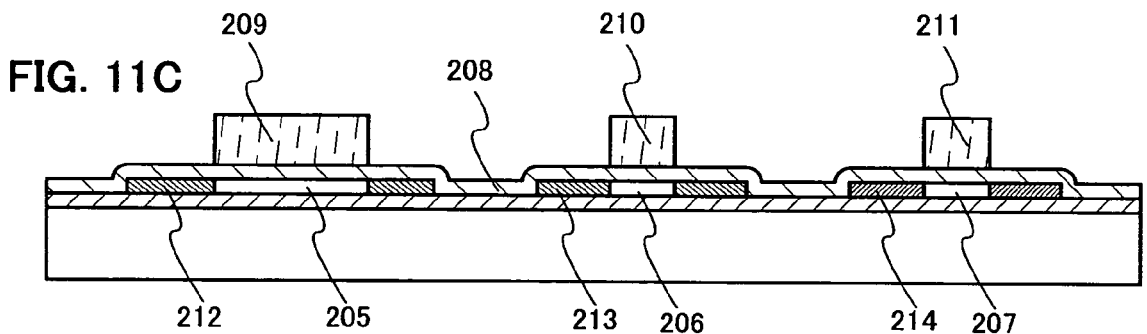

In FIG. 11C, the second insulating layer 208 which functions also as a gate insulating film is formed to cover the semiconductor layers 205, 206 and 207. The second insulating layer 208 may be formed with silicon oxide or silicon oxynitride. The second insulating layer may be formed by a low pressure CVD method or a plasma CVD method or may be formed by performing thermal oxidation on the surfaces of the semiconductor layers 205, 206 and 207 in case of using quartz for the insulating substrate.

Subsequently, masks 209, 210 and 211 are formed over the semiconductor layers 205, 206 and 207, respectively. The masks 209, 210 and 211 are used in selectively adding an impurity element having one conductivity or the other type conductivity to the semiconductor layers 205, 206 and 207. The masks are formed using a photosensitive resist material to cover regions to be mainly channel forming regions. N-type or p-type impurity regions are formed in the semiconductor layers 205, 206 and 207 by utilizing the masks 209, 210 and 211. Although the types of the impurity regions are not particularly limited, n-type impurity regions 212 and 213 are formed in the semiconductor layers 205 and 206 and a p-type impurity region 214 is formed in the semiconductor layer 207 in this embodiment mode.

Figure 11D:
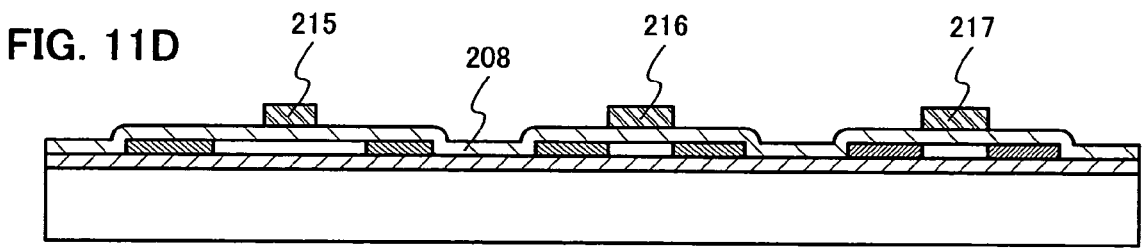

As shown in FIG. 11D, gate electrodes 215, 216 and 217 are formed over the second insulating layer 208 to correspond to the impurity regions. The gate electrodes may contain a metal having a high melting point such as tungsten, titanium or tantalum, silicide thereof, polysilicon or the like. A low concentration impurity region (LDD region) may be provided corresponding to a position of the gate electrode, although not shown. The gate electrode 215 over the semiconductor layer 205 is formed between the n-type impurity regions 212 to make it a floating gate. Channel forming regions are formed in the regions where the gate electrodes 215, 216 and 217 overlap the semiconductor layers 205, 206 and 307, respectively.

Figure 11E:
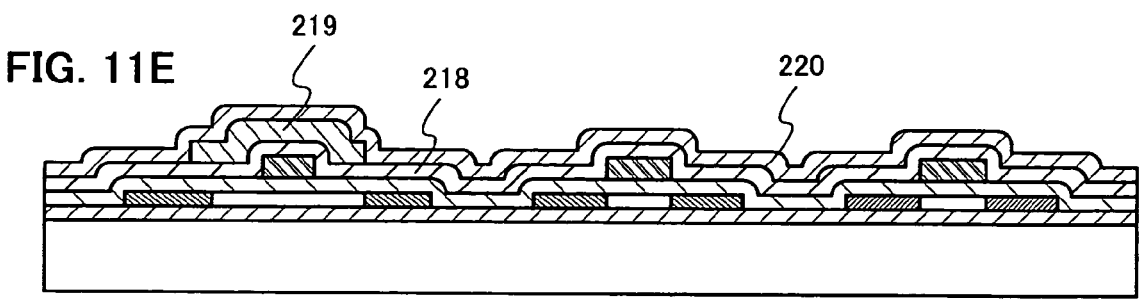

As shown in FIG. 11E, a third insulating layer 218 is formed, and then, a control gate 219 is formed in a position corresponding to the gate electrode (floating gate) 215. A fourth insulating layer 220 is formed to be an upper layer of the gate electrode as a protective layer.

After the semiconductor layers and the gate electrodes are formed as described above, a fifth insulating layer 221 may be formed to have an even surface as shown in FIG. 10. In this case, the fifth insulating layer 221 can be formed using PSG (phosphosilicate glass), BPSG (boro-phosphosilicate glass), or the like by reflow planarization. Alternatively, a planarizing film may be formed by applying a resin material such as polyimide or acrylic by spin coating, or a silicone resin, typically, an organic siloxane applied film may be formed.

The wiring 222 can be in contact with the impurity region formed in the semiconductor layer by forming a contact hole through the second to fifth insulating layers. Arrangement of the wiring 222 and the contact hole may be appropriately designed for a desired circuit structure.

A connection terminal to be necessary in forming the ID chip may be formed in the same layer as the wiring 222, or a sixth insulating layer 223 may be formed and a connection terminal portion 224 may be formed over the sixth insulating layer.

As described above, the TFT 225 provided with the floating gate and the control gate, the n-channel TFT 226 and the p-channel TFT 227 are formed over the insulating substrate 201 as shown in FIG. 10. The TFT 225 provided with the floating gate and the control gate forms the memory, and the n-channel TFT 226 and the p-channel TFT 227 form the signal control circuit and the communication circuit.

Figure 13:
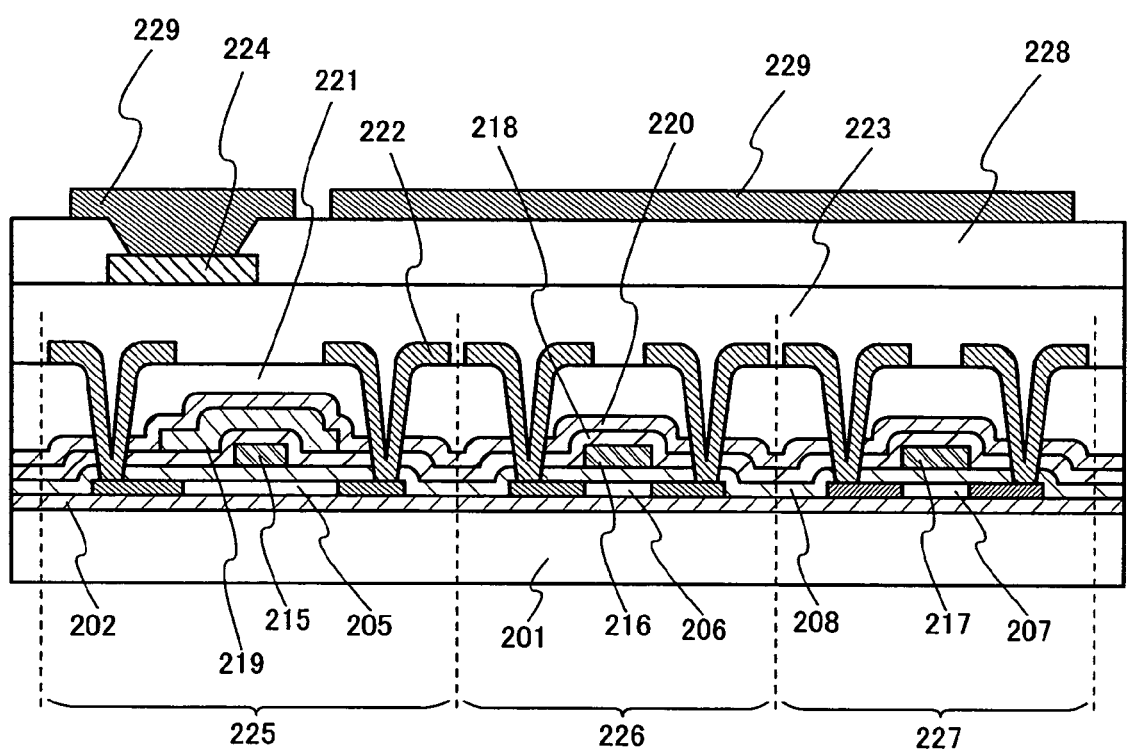
Figure 14:
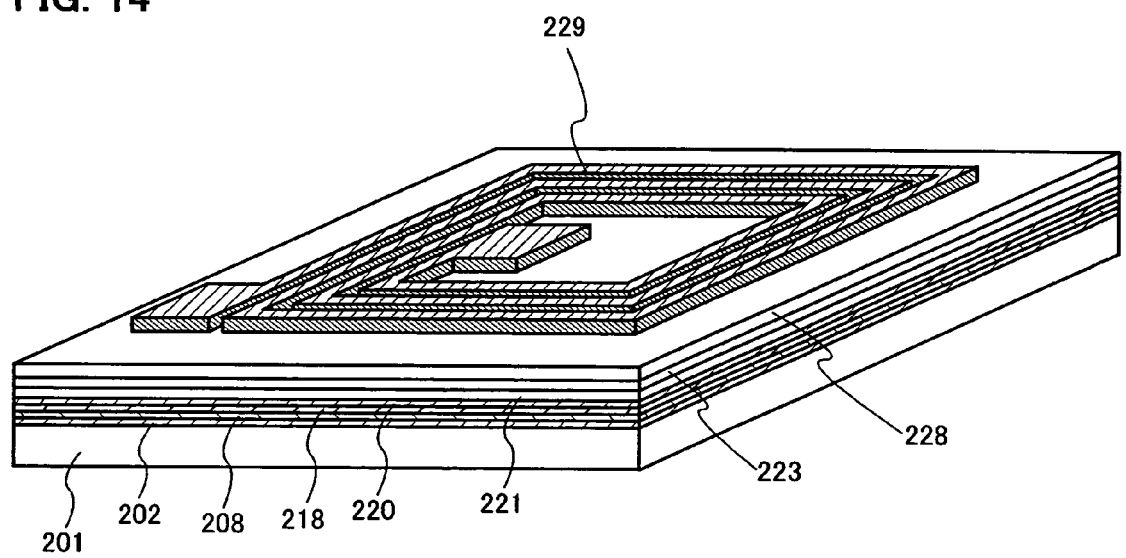
FIG. 14 is a perspective view of an ID chip in which an antenna 229 is formed over an insulating substrate 201.

As shown in FIG. 13, an antenna 229 may be formed over the seventh insulating layer 228. The antenna 229 may be formed by a printing method using silver or copper paste, or may be formed by etching a laminated layer of tantalum nitride and copper formed by a sputtering method. FIG. 14 is a perspective view of an ID chip having the antenna 229 formed over the insulating substrate 201, in which the antenna 229 is a loop antenna. A length of the antenna depends on a frequency band to be utilized. In the case of utilizing a short wave band like 13.56 MHz, the length of approximately 50 mm is sufficient. Accordingly, only approximately five to ten times winding is enough even in forming the antenna over the ID chip.

Productivity of such an ID chip can be improved by using a large-area glass substrate. For example, a fourth-generation liquid crystal panel which is distributed to the market has a size of 730 mm×920 mm and an area of 671600 mm². In the case of cutting out 2 mm square chips, 340 thousand chips can be obtained by estimate even if a margin of a chip is ignored. Approximately 670 thousand chips in the case of 1 mm square chips and 4 million chips in the case of 0.4 mm square chips can be obtained.

A glass substrate has a thickness of from 0.4 mm to 0.7 mm, and it can be thinned to approximately from 0.1 mm to 0.3 mm when a protective film is attached to an opposite side to a face to be provided with a TFT.

Even when a new production line for an integrated circuit including a TFT over such a large-area glass substrate is build, the amount of facility investment is several ten billion yen. Compared with a production line for a 12-inch wafer, it only costs half or less. This proves that a large quantity of RFID semiconductor devices, typically, RFID tags and label-like objects can be provided at low cost by applying the present invention.

Figure 15:
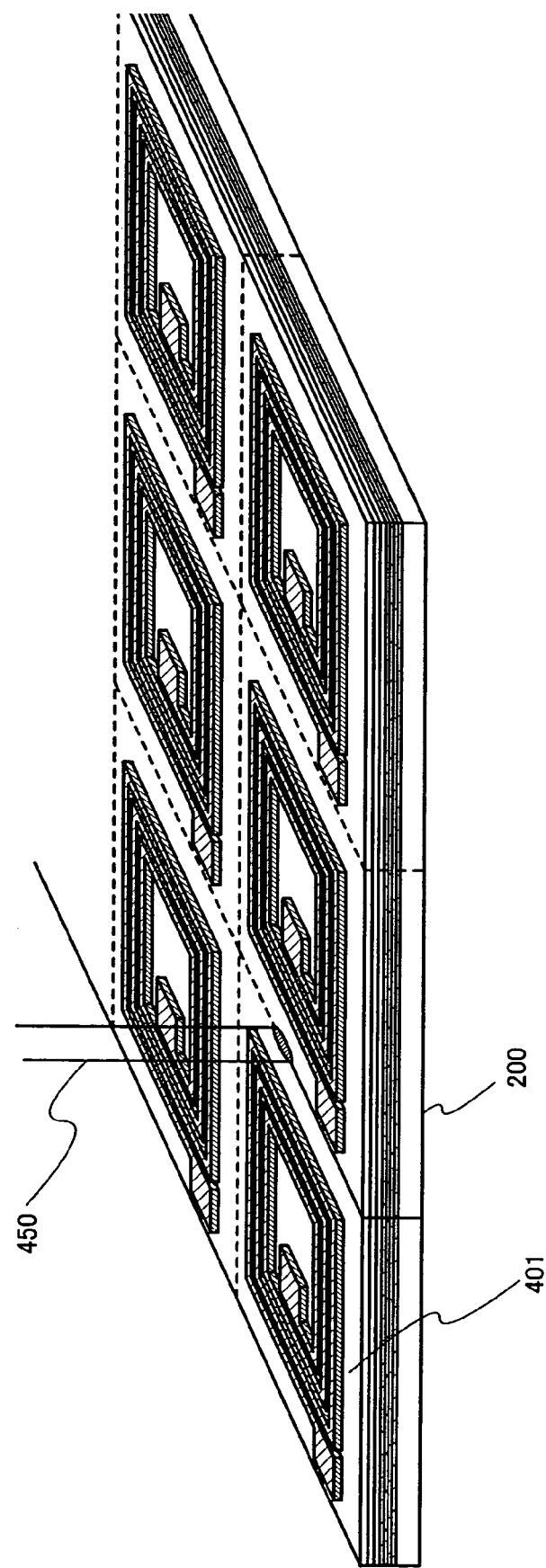
FIG. 15 shows one mode of separating an ID chip from a mother glass substrate by a laser process.

In order to separate the ID chips 401 from each other after forming the chips over a large-area glass substrate, a separating process from a mother glass substrate 200 can be easily performed by using a $CO_2$ laser 450 as shown in FIG. 15. An area to be wasted as a margin for separation is extremely small in the case of using the $CO_2$ laser, and several tens of micrometers may be sufficient for a margin required for a separation process.

A method for making radio frequency identification of an article mounted with such an ID chip is described with reference to FIG. 16.

Figure 16:
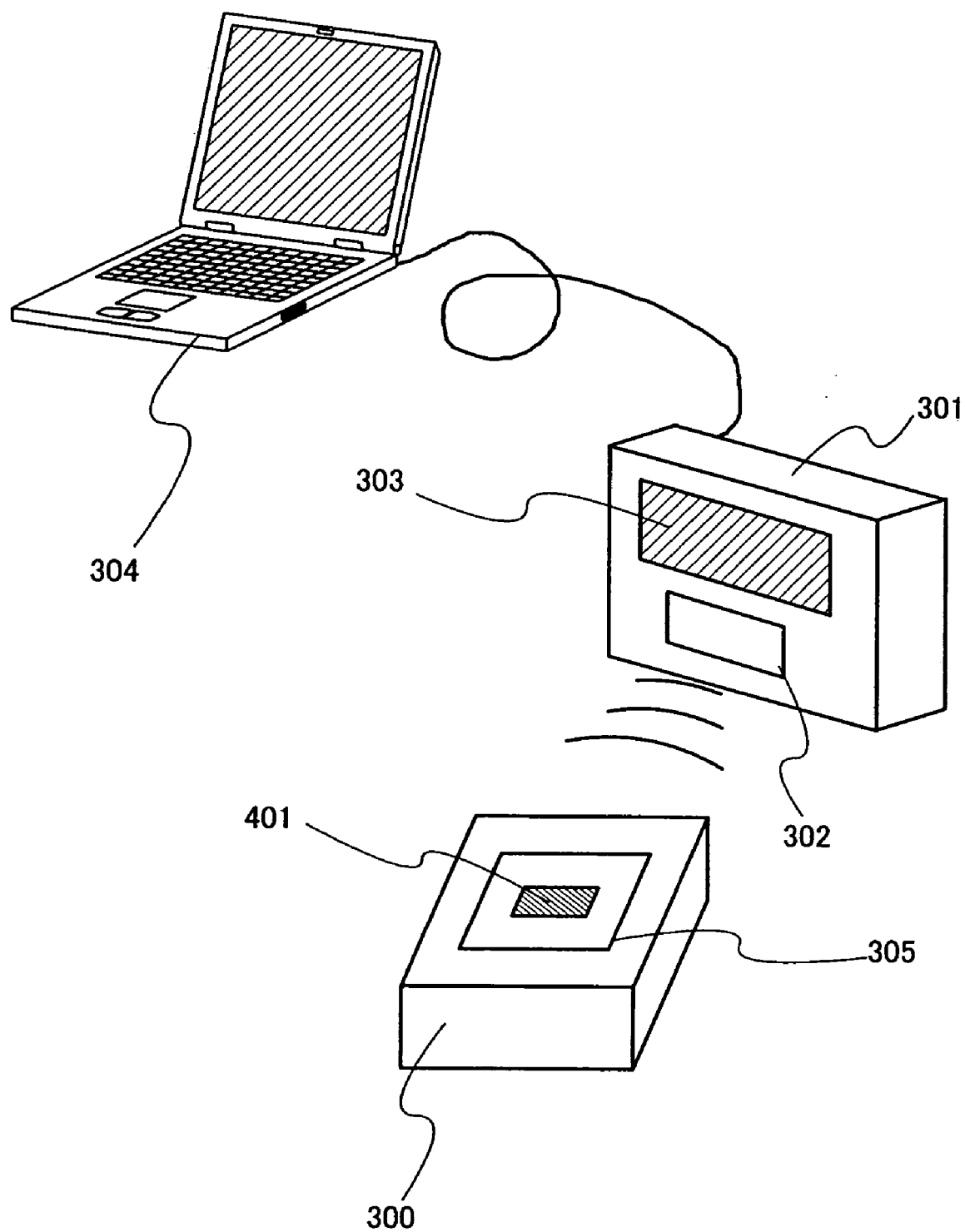
FIG. 16 shows an example of a mode of using an article mounted with an ID chip of the present invention.

Radio frequency identification can be made by bringing an article 300 having an RFID tag 305 incorporating an ID chip 401 close to an antenna portion of a reader/writer module 302 in a reader/writer device 301 as shown in FIG. 16. Here, an antenna is incorporated in the RFID tag 305 provided with the ID chip 401.

Product information stored in the ID chip 401, such as a material, a place of origin, a test result of each production (manufacturing) step, a record during a distribution process, a product description, or the like can be displayed in a display portion 303 of the reader/writer device 301. Of course, the reader/writer device 301 is not necessarily provided with the display portion 303. The ID chip 401 may be monitored by a computer 304 and new information may be written in the ID chip 401. In the case of storing new information, it can be written in the ID chip 401 by radio communication from the reader/writer module 302.

Figure 17:
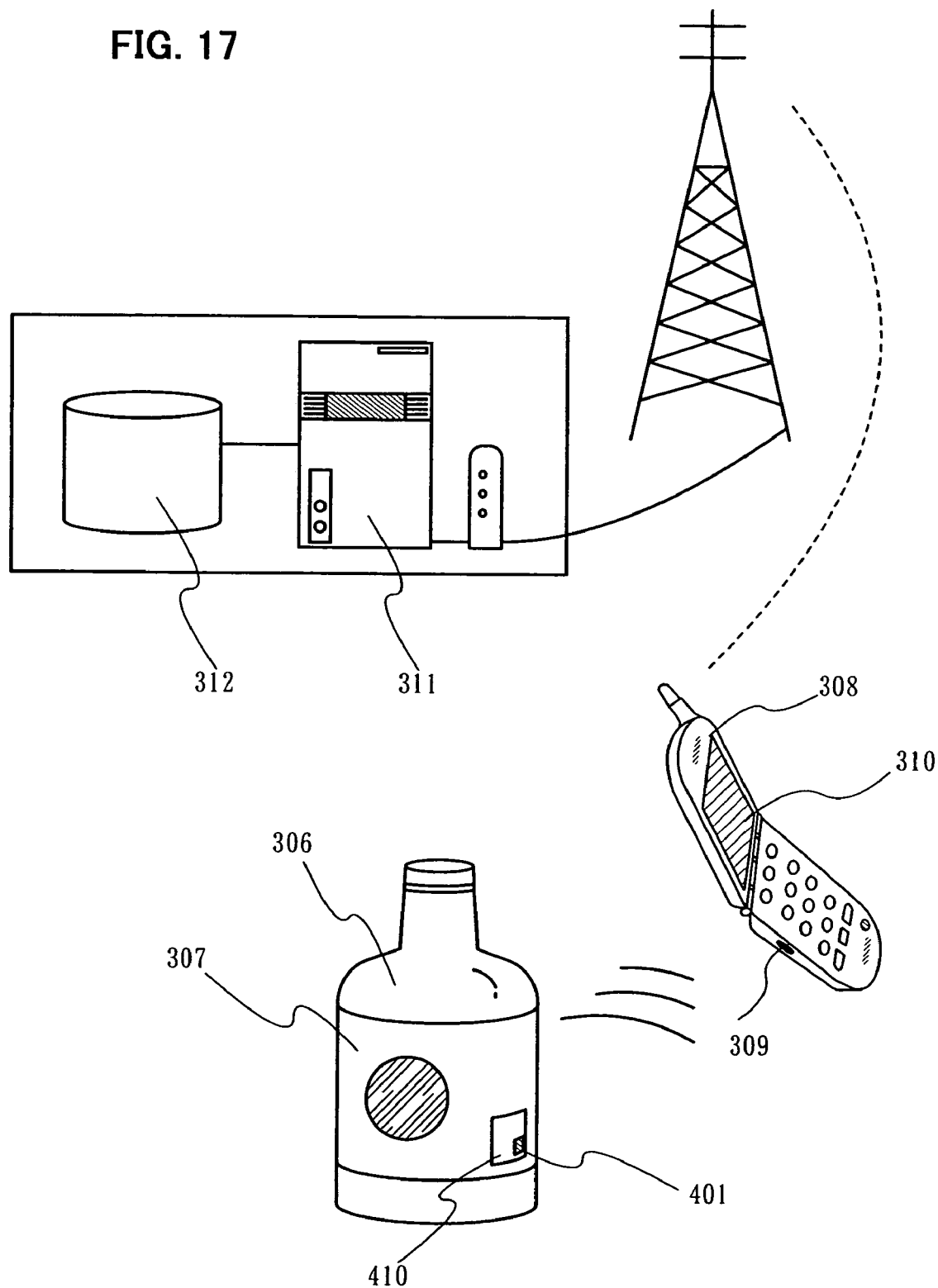
FIG. 17 shows an example of a mode of using an article mounted with an ID chip of the present invention.

In an article 306 shown in FIG. 17, a label-like object 307 attached to the article 306 is prrovided with an ID chip 401. The ID chip 401 may be attached together with a support 410 provided with an antenna as sown in FIGS. 2A to 2C. Needless to say, another mode of the ID chip as shown in FIG. 4, 6, or 8 may be provided as another structure. The label-like object 307 does not visually differ from ordinary packaging at all, but it can be practically utilized as an RFID tag.

When a reader/writer module 309 is mounted on a personally owned handheld terminal 308, information stored in the ID chip 401 can be read out and the content thereof can be displayed in a display portion 310. Of course, all information need not be stored in the ID chip 401. Only an identification number of several bits is stored, and detailed information can be obtained from a recording medium 312 connected to a host computer 311 by utilizing a telephone communication function of the handheld terminal 308 and can be made visible with the display portion 310.

Figure 18:
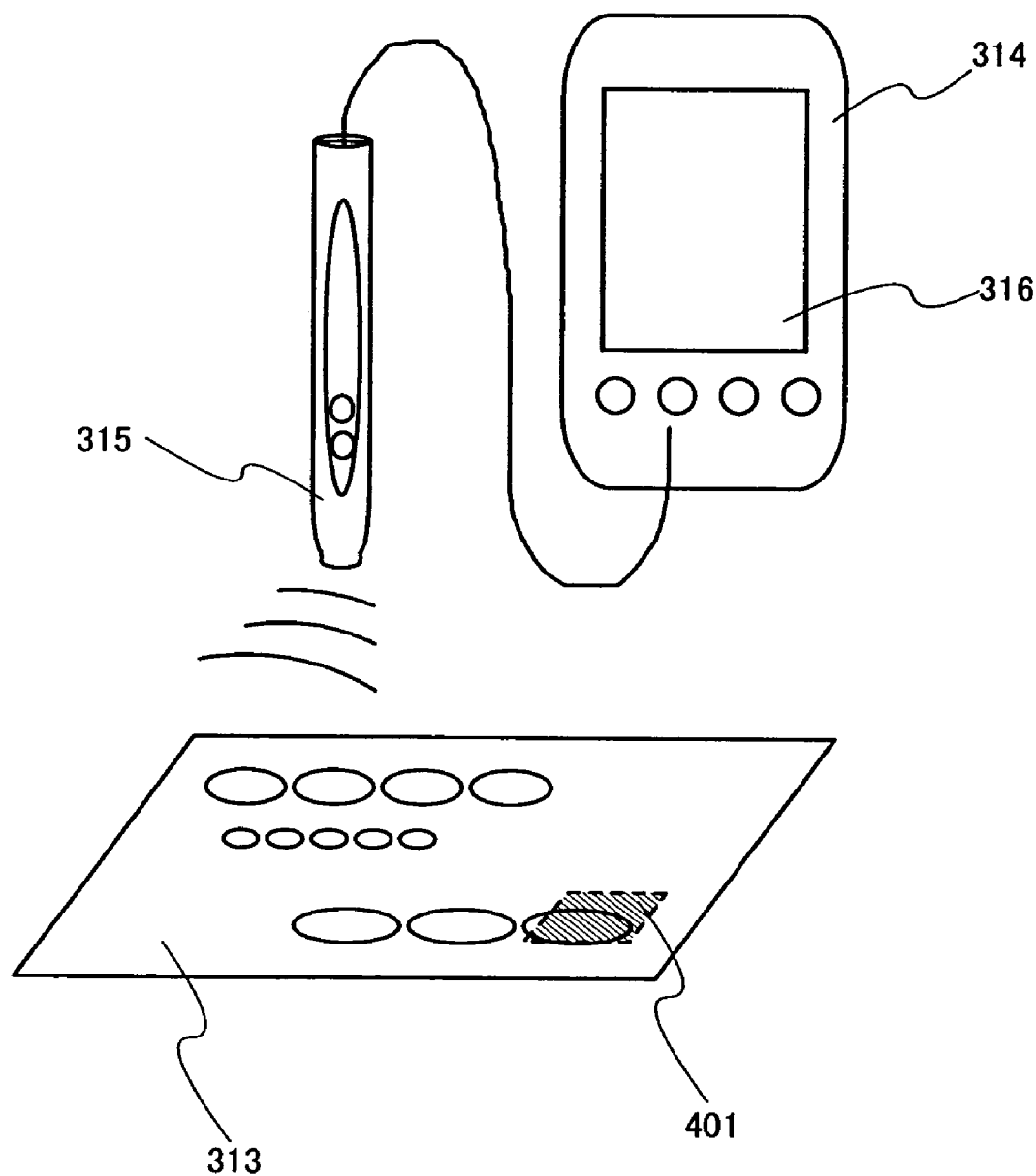
FIG. 18 shows an example of a mode of using an article mounted with an ID chip of the present invention.

FIG. 18 shows an example of a piece of banknotes and securities 313, to which an ID chip 401 integrally provided with such an antenna as shown in FIG. 14 is attached. Information recorded in the ID chip 401 can be displayed in a display portion 316 by bringing a reader module 315 of a reader device 314 close to the piece of banknotes and securities 313. For example, banknotes and securities can be authenticated based on the information. In this case, it is preferable that the ID chip 401 is a read-only memory including a mask ROM.

In addition, an RFID semiconductor device, an RFID tag and a label-like object of the present invention may be attached to a product label, and may also be utilized to control distribution of products.

Figure 19:
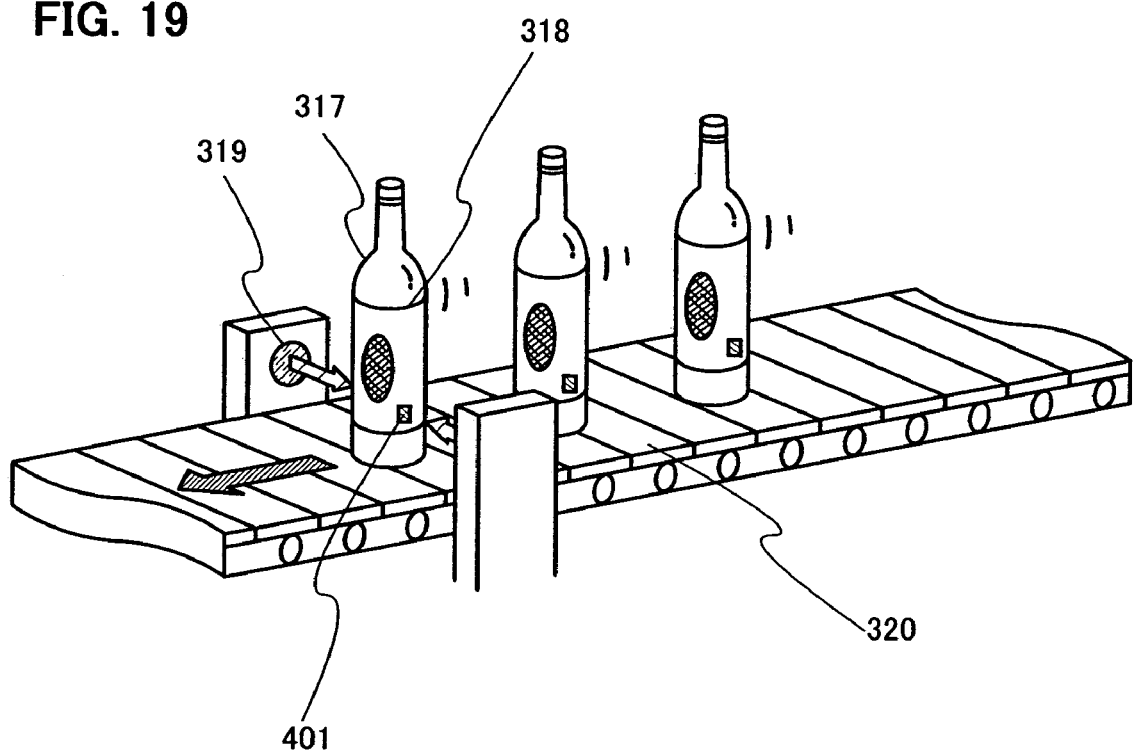
FIG. 19 shows one mode of controlling distribution of products by attaching an RFID tag and a label-like object of the present invention to products.

As shown in FIG. 19, a label-like object 318 to which an ID chip 401 is fixed is attached to an article 317. Identification information on the article 317 can be read out of the ID chip 401 fixed to the label-like object 318 by radio. In the label-like object 318, an antenna and an ID chip are integrated as shown in FIGS. 2A to 2C, 4A to 4C, 6A to 6C, 8A to 8C and the like. Information stored in the ID chip 401 can be read out by a sensor portion 319 in which a reader/writer module is incorporated.

FIG. 19 shows a mode of continuously or simultaneously reading out information, without contact, in the ID chip 401 attached to the article 317 transported by a conveyor belt 320. In the case of using a nonvolatile memory as a memory in the ID chip 401, a distribution process of the article 317 can be recorded. In addition, it becomes easier for a wholesaler, a retailer and a consumer to know a place of origin, a producer, a manufacturing date, a processing method and the like by recording a process at the production stage of a product.

The contactless reader/writer is described here; however, even in the case of a contact type, information may be displayed in a display portion. In addition, a product itself mounted with a contactless or contact RFID tag can be provided with a display portion, and information can be displayed in the display portion.

The invention can be applied in various modes as described above. In addition, the invention provides a semiconductor device, an RFID tag and a label-like object used for an RFID technology in large quantity at low cost in response to increasing demand due to applicability of the invention in such a wide range of fields.

What is claimed is:

1. A semiconductor device comprising:
   an insulating substrate;
   a memory portion over the insulating substrate;
   a signal control circuit portion over the insulating substrate;
   a communication circuit portion over the substrate and connected to a terminal portion; and
   an antenna electrically connected to the terminal portion,
   wherein each of the memory portion, the signal control circuit portion and the communication circuit portion comprises a thin film transistor comprising a crystalline semiconductor layer comprising a channel forming region formed over the insulating substrate.

2. A semiconductor device according to claim 1, wherein the insulating substrate is formed of one of glass, quartz and plastic.

3. A semiconductor device according to claim 1, wherein the antenna is electrically connected to the terminal portion through an anisotropic conductive adhesive.

4. A semiconductor device comprising:
   an insulating substrate;
   a memory portion over the insulating substrate;
   a signal control circuit portion over the insulating substrate;
   a communication circuit portion connected to a terminal portion over the insulating substrate; and
   a support over the memory portion, the signal control circuit portion and the communication circuit portion,
   wherein the support is provided with an antenna, wherein the antenna is electrically connected to the terminal portion, and wherein each of the memory portion, the signal control circuit portion and the communication circuit portion comprises a thin film transistor comprising a crystalline semiconductor layer comprising a channel forming region formed over the first insulating substrate.

5. A semiconductor device according to claim 4, wherein the insulating substrate is formed of one of glass, quartz and plastic.

6. A semiconductor device according to claim 4, wherein the antenna is electrically connected to the terminal portion through an anisotropic conductive adhesive.

7. A label-like object comprising;
an ID chip comprising:
a memory portion;
a signal control circuit portion;
a communication circuit portion; and
a terminal portion; and
an antenna electrically connected to the terminal portion,
wherein each of the memory portion, the signal control circuit portion and the communication circuit portion comprises a thin film transistor comprising a crystalline semiconductor layer comprising a channel forming region formed over an insulating substrate, and
wherein the label-like object is capable of sending data stored in the memory portion or receiving data to be stored in the memory portion through the communication circuit by radio communication.

8. A label-like object according to claim 7, wherein the antenna is formed adjacent to an insulating substrate.

9. A label-like object according to claim 8, wherein the insulating substrate is formed of one of glass, quartz and plastic.

10. A label-like object according to claim 7, wherein the antenna is electrically connected to the terminal portion through an anisotropic conductive adhesive.

11. A label-like object comprising;
an insulating substrate;
an ID chip over the insulating substrate, comprising:
a memory portion;
a signal control circuit portion;
a communication circuit portion; and
a terminal portion;
a support over the ID chip; and
one of a label and a packaging,
wherein the support is provided with an antenna electrically connected to the terminal portion,
wherein each of the memory portion, the signal control circuit portion and the communication circuit portion comprises a thin film transistor comprising a crystalline semiconductor layer comprising a channel forming region formed over the insulating substrate,
wherein one of the insulating substrate and the support is attached to the one of the label and the packaging.

12. A label-like object according to claim 11, wherein the insulating substrate is formed of one of glass, quartz and plastic.

13. A label-like object according to claim 11, wherein the antenna is electrically connected to the terminal portion through an anisotropic conductive adhesive.

14. A label-like object comprising;
an insulating substrate provided with an ID chip;
one of a label and a packaging provided with an antenna;
wherein the ID chip comprises:
a memory portion;
a signal control circuit portion;
a communication circuit portion; and
a terminal portion;
wherein the antenna is electrically connected to the terminal portion,
wherein the ID chip and the antenna are facing to each other, and
wherein each of the memory portion, the signal control circuit portion and the communication circuit portion comprises a thin film transistor comprising a crystalline semiconductor layer comprising a channel forming region.

15. A label-like object according to claim 14, wherein the insulating substrate is formed of one of glass, quartz and plastic.

16. A label-like object according to claim 14, wherein the antenna is electrically connected to the terminal portion through an anisotropic conductive adhesive.

* * * * *